(12) United States Patent
Hashimoto et al.

(10) Patent No.: US 9,260,241 B2
(45) Date of Patent: Feb. 16, 2016

(54) PLATE-SHAPED MEMBER TRANSFER FACILITY

(75) Inventors: Yasuhiko Hashimoto, Kobe (JP); Tetsuya Yoshida, Kakogawa (JP)

(73) Assignee: KAWASAKI JUKOGYO KABUSHIKI KAISHA, Kobe-shi (JP)

( * ) Notice: Subject to any disclaimer, the term of this patent is extended or adjusted under 35 U.S.C. 154(b) by 450 days.

(21) Appl. No.: 13/805,164

(22) PCT Filed: Jun. 10, 2011

(86) PCT No.: PCT/JP2011/003301
§ 371 (c)(1),
(2), (4) Date: Apr. 8, 2013

(87) PCT Pub. No.: WO2012/004936
PCT Pub. Date: Jan. 12, 2012

(65) Prior Publication Data
US 2013/0202393 A1    Aug. 8, 2013

(30) Foreign Application Priority Data

Jul. 9, 2010   (JP) .................................. 2010-157070

(51) Int. Cl.
*B65G 65/00*     (2006.01)
*B65G 1/04*      (2006.01)
(Continued)

(52) U.S. Cl.
CPC ............... *B65G 1/04* (2013.01); *B65G 49/062* (2013.01); *B65G 49/063* (2013.01); *B65G 49/067* (2013.01); *B65G 49/068* (2013.01); *H01L 21/67718* (2013.01); *H01L 21/67736* (2013.01); *H01L 21/67769* (2013.01)

(58) Field of Classification Search
CPC .. B65G 49/063; B65G 49/067; B65G 49/068; H01L 21/67718; H01L 21/67736
See application file for complete search history.

(56) References Cited

U.S. PATENT DOCUMENTS

| 4,716,686 A | * | 1/1988 | Lisec ............................. 451/184 |
| 6,121,743 A | | 9/2000 | Genov et al. |
| 7,878,754 B2 | * | 2/2011 | Mercure ....................... 414/801 |

(Continued)

FOREIGN PATENT DOCUMENTS

| JP | 2-105906 | * | 8/1990 |
| JP | A-2002-179204 | | 6/2002 |

(Continued)

OTHER PUBLICATIONS

International Search Report issued in International Patent Application No. PCT/JP2011/003301 dated Sep. 27, 2011.

(Continued)

*Primary Examiner* — Saul Rodriguez
*Assistant Examiner* — Mark Hageman
(74) *Attorney, Agent, or Firm* — Oliff PLC

(57) ABSTRACT

A stocker facility includes a rack configured to store glass plates in a standing state such that the glass plates are arranged in a front-rear direction and a stocker configured to cause the glass plate to move in a left-right direction to transfer the glass plate to and from the rack. Thus, the present invention provides a plate-shaped member transfer facility capable of carrying the plate-shaped member in between two spaced-apart plate-shaped members between which a storage pitch is short and carrying any one of a plurality of plate-shaped members out from the rack without inserting an end effect in a substrate storage portion of the rack.

7 Claims, 29 Drawing Sheets

(51) Int. Cl.
*B65G 49/06* (2006.01)
*H01L 21/677* (2006.01)

(56) References Cited

U.S. PATENT DOCUMENTS

| | | | |
|---|---|---|---|
| 2005/0279199 A1* | 12/2005 | Bavelloni | 83/13 |
| 2007/0092359 A1 | 4/2007 | Pickreign et al. | |
| 2007/0190898 A1* | 8/2007 | Mercure | 451/6 |
| 2013/0202394 A1* | 8/2013 | Hashimoto et al. | 414/277 |

FOREIGN PATENT DOCUMENTS

| | | |
|---|---|---|
| JP | A-2002-522238 | 7/2002 |
| JP | A-2004-277164 | 10/2004 |
| JP | A-2006-8396 | 1/2006 |
| JP | A-2009-238904 | 10/2009 |
| TW | 200902403 A | 1/2009 |
| WO | WO 2008/048483 A2 | 4/2008 |

OTHER PUBLICATIONS

Office Action and Search Report issued in Taiwanese Application No. 100121774 issued Dec. 17, 2013 (with partial translation).

* cited by examiner

PLATE-SHAPED MEMBER TRANSFER FACILITY

TECHNICAL FIELD

The present invention relates to a plate-shaped member transfer facility including: a rack capable of storing a plurality of plate-shaped members such that the plurality of plate-shaped members are arranged in a standing state; and a plate-shaped member transfer mechanism configured to insert the plate-shaped member in the rack and take out the plate-shaped member from the rack.

BACKGROUND ART

Various conveying apparatuses configured to convey substrates are conventionally known. One example of such conveying apparatuses is a robot configured to store the substrates in a rack (a cassette, or the like) and take out the substrates stored in the rack as disclosed in PTL 1. The robot described in PTL 1 includes a robot arm. The robot arm includes three links, and these three links are coupled to one another so as to be rotatable about a vertical axis line extending in a vertical direction. An end effector is attached to a tip end portion of the robot arm. The end effector is configured such that the substrate can be mounted on a tip end side portion thereof, and a tip end portion thereof is rotatable about a horizontal axis line extending in a horizontal direction.

The robot configured as above causes the end effector to move while causing three links to rotate. Thus, the robot inserts the substrate, mounted on the end effector, in the rack and takes out the substrate from the rack. In addition, the robot can cause the tip end portion of the end effector to rotate about the horizontal axis line to stand or lay the substrate mounted on the end effector. Therefore, the robot can insert the end effector in the rack from various directions. Regardless of the position of the rack, the robot can insert the substrate in the rack and take out the substrate from the rack.

CITATION LIST

Patent Literature

PTL 1: Published Japanese Translation of PCT Application No. 2002-522238

SUMMARY OF INVENTION

Technical Problem

When the robot described in PTL 1 inserts the substrate in the rack and takes out the substrate from the rack, the robot inserts the end effector in a substrate storage portion of the rack, the substrate storage portion being configured to store the substrate. As shown in FIGS. 30 and 31, a plurality of substrates 51 to 53 are arranged in an arrangement direction to be stored in a rack 54 such that the plurality of substrates 51 to 53 do not contact one another. An open space is formed, in which an end effector 55 can be inserted in front of the substrate to be carried out among the substrates 51 to 53. Therefore, in the case of carrying the plurality of substrates 51 to 53 out in order from the foremost substrate that is the substrate 51, the usage of the end effector 55 does not cause any problem regarding the operation of carrying the substrates out.

However, the plurality of substrates 51 to 53 stored in the rack 54 are not necessarily carried out in order from the substrate 51, and the substrate 52 stored between two substrates 51 and 53 is frequently taken out first. In this case, the end effector 55 needs to be inserted between two substrates 51 and 52 (or two substrates 52 and 53).

Generally, a storage interval between adjacent substrates is set as short as possible in order to increase the number of substrates stored in an installation area of the rack 54. The end effector is configured to be thick since it has to have a function of sandwiching the substrate and secure stiffness. Therefore, even if the robot tries to insert the end effector in between two substrates 51 and 52 (or two substrates 52 and 53), the robot cannot insert it. Even if the robot could insert the end effector, the end effector may hit and break the substrates 51 to 53 and the like. On this account, the storage interval between the substrates in the rack 54 needs to be increased drastically. In this case, the installation area of the rack 54 increases.

This problem occurs not only in the case of carrying the substrates 51 to 53 out but also in the case of carrying the substrates 51 to 53 in. To be specific, no problem occurs in the case of carrying the substrates 51 to 53 in the rack in order in the arrangement direction. However, in a case where two substrates 51 and 53 are carried in the rack 54 first, and then the substrate 52 is carried in the rack 54, the same problem as the above case of carrying the substrate out occurs. To solve this problem, the storage interval between the substrates in the rack 54 needs to be increased drastically, and this increases the installation area of the rack 54.

Here, an object of the present invention is to provide a plate-shaped member transfer facility capable of carrying a plate-shaped member in between two spaced-apart plate-shaped members carrying any of a plurality of stored plate-shaped members out from the rack without inserting an end effector in a substrate storage portion of a rack even if a storage pitch between the plate-shaped members is short.

Solution to Problem

A plate-shaped member transfer facility of the present invention includes: a rack configured to store a plurality of plate-shaped members such that the plurality of plate-shaped members are arranged in an arrangement direction intersecting with a conveying direction, the plurality of plate-shaped members being supported by supporting portions and standing to extend in the conveying direction, the rack further configured such that the plurality of plate-shaped members are able to be carried therein in the conveying direction and carried out therefrom in the conveying direction; and a plate-shaped member transfer mechanism configured to carry the plate-shaped members in the rack in the conveying direction and carry the plate-shaped members out from the rack in the conveying direction, wherein: the plate-shaped member transfer mechanism includes a flip rotating mechanism including a flip and configured to cause the flip to rotate to stand or lay the plate-shaped member, the flip being configured to support the plate-shaped member and be rotatable about a rotation axis line parallel to the conveying direction, a conveying mechanism including a conveyance body in which a feed portion is formed, the feed portion extending in the conveying direction and being configured to transfer the plate-shaped member in a standing state in the conveying direction, and a transporting mechanism configured to cause the flip rotating mechanism and the conveying mechanism to move in the arrangement direction; and the conveying mechanism is configured such that the plate-shaped member in the standing state is transferred between the rack and the flip by the feed portion.

According to the present invention, the plate-shaped member transfer mechanism can cause the flip to rotate by the flip rotating mechanism to stand the plate-shaped member supported by the flip. Further, the plate-shaped member transfer mechanism can cause the flip rotating mechanism and the conveying mechanism to move in the arrangement direction of the rack to an arbitrary position and causes the plate-shaped member in a standing state to move in the conveying direction by a feed portion to carry and store the plate-shaped member in the rack. As above, the plate-shaped member transfer mechanism can stand the horizontal-state plate-shaped member and insert and store the plate-shaped member in the rack. In the present invention, the "horizontal state" denotes not only a completely horizontal state but also a slightly inclined state relative to the completely horizontal state.

In the present invention, by causing the flip rotating mechanism and the conveying mechanism to move to the arbitrary position of the rack and driving the feed portion, the plate-shaped member stored in the rack can be caused to move in the conveying direction to be returned onto the flip. After the plate-shaped member is mounted on the flip serving as an end effector, the flip rotating mechanism causes the flip to rotate and be laid. Thus, the plate-shaped member can be laid in the horizontal state. As above, the plate-shaped member transfer mechanism can take out the plate-shaped member stored in the rack in a standing state and be laid in the horizontal state.

As above, in the present invention, the plate-shaped member is caused to move in the conveying direction by the feed portion to be transferred. Therefore, when the plate-shaped member is carried in the rack or carried out from the rack, it is unnecessary to directly insert the conveyance body and the flip into a substrate storage portion of the rack. With this, even if the interval between the plate-shaped members is reduced, that is, the storage pitch between the plate-shaped members in the arrangement direction is shortened in order to reduce the installation area of the facility, the plate-shaped member can be carried in between two plate-shaped members, and any one of the plurality of plate-shaped members stored in the rack can be carried out without causing a problem in which the stored plate-shaped member and the end effector contact each other to be damaged as in the prior art. Therefore, the plate-shaped member can be surely, quickly carried in the rack and carried out from the rack.

In the above invention, it is preferable that the conveying mechanism be configured to be able to cause the conveyance body to move in the conveying direction from the flip to extend into the rack.

According to the above configuration, by causing the conveyance body to extend into the rack, the plate-shaped member can be caused to move to the back side in the rack by the feed portion. With this, it becomes unnecessary to provide a conveying mechanism in the rack. Thus, the number of components can be reduced. On this account, the manufacturing cost can be reduced.

In the above invention, it is preferable that the conveying mechanism be configured to be able to cause the conveyance body to move in the upper-lower direction.

According to the above configuration, by causing the conveyance body to move in the upper-lower direction in accordance with the position of the rack, the difference in height between the conveyance body and the rack when transferring the plate-shaped member can be eliminated. Thus, the plate-shaped member can be prevented from falling down in the rack due to the difference in height to be damaged.

In the above invention, it is preferable that: the plurality of supporting portions be arranged in the rack so as to be spaced apart from one another in the conveying direction; the feed portion of the conveyance body include a plurality of driving members arranged in the conveyance body so as to be scattered in the conveying direction and configured to transfer the plate-shaped member in the conveying direction; and a plurality of recesses be formed on the conveyance body so as to correspond to the plurality of supporting portions, and the at least one driving member be provided at a convex portion formed between the adjacent recesses.

According to the above configuration, when the conveyance body is caused to extend into the rack, and the supporting portion is inserted in the recess of the conveyance body, the driving members attached to the convex portion can be exposed from between the adjacent supporting portions. By exposing the driving members from between the supporting portions, the plate-shaped member can be caused to move smoothly in the rack by the driving members.

In the above invention, it is preferable that the conveying mechanism be configured to: position the conveyance body such that an upper end of the convex portion is lower in position than the supporting portions of the rack at a reference position at which the conveyance body is located on a conveying-direction near side of the rack; causes the conveyance body to move in the conveying direction from the reference position to position the recess under the supporting portions of the rack; and cause the conveyance position to move upward such that upper ends of the driving members are higher in position than the supporting portions of the rack.

According to the above configuration, the supporting portion can be inserted in the recess of the conveyance body, and the driving members provided on the convex portions can be caused to be exposed from between the supporting portions.

In the above invention, it is preferable that: the flip include a supporting portion configured to support the plate-shaped member when the flip stands; and the conveying mechanism be configured such that when the conveyance body is moved upward, the plate-shaped member supported by the supporting portion of the flip is mounted on the driving members.

According to the above configuration, by causing the conveyance body to move upward, the plate-shaped member is mounted on the driving members. By causing the flip to stand and causing the conveyance body to move upward, the plate-shaped member can be mounted on the driving members. Therefore, the plate-shaped member can be easily transferred between the flip and the driving members.

In the above invention, it is preferable that the flip include a plurality of spherical rollers configured to be able to roll and be configured to support a rear surface of the plate-shaped member by the plurality of spherical rollers.

According to the above configuration, the plate-shaped member is supported by the spherical rollers configured to roll. Therefore, when the plate-shaped member is caused to move by a feed portion, the plate-shaped member can be caused to move smoothly with the plate-shaped member leaning on the flip. With this, when transferring the plate-shaped member between the rack and the flip, the plate-shaped member can be caused to slide along the flip, and the flip can be prevented from falling.

In the above invention, it is preferable that the flip rotating mechanism be configured to, when the flip rotating mechanism moves, cause the flip to rotate to lay the plate-shaped member supported by the flip.

According to the above configuration, the flip rotating mechanism is caused to move with the plate-shaped member laid. Therefore, the air flow rate of wind generated by the movement of the plate-shaped member can be reduced. The wind generated by the movement may cause the clattering of the plate-shaped members arranged and stored in the rack and the damages of the plate-shaped members. However, since the wind can be suppressed in the present invention, the clattering of the plate-shaped members can be suppressed, and the damages of the plate-shaped members can be prevented.

Advantageous Effects of Invention

The present invention can carry the plate-shaped member in between two spaced-apart plate-shaped members between which the storage pitch is short and carry any one of a plurality of plate-shaped members out from the rack without inserting the end effector in the substrate storage portion of the rack.

DESCRIPTION OF EMBODIMENTS

Hereinafter, a stocker facility 1 according to an embodiment of the present invention will be explained in reference to the drawings. In the embodiment, the concept of directions, such as upper, lower, left, right, front, and rear directions, is used for convenience of explanation and does not indicate that the arrangements, directions, and the like of components of the stocker facility 1 are limited to such directions. The stocker facility 1 explained below is just one embodiment of the present invention, and the present invention is not limited to the embodiment. Additions, eliminations, and modifications may be made within the spirit of the present invention.

Stocker Facility

Figure 1:
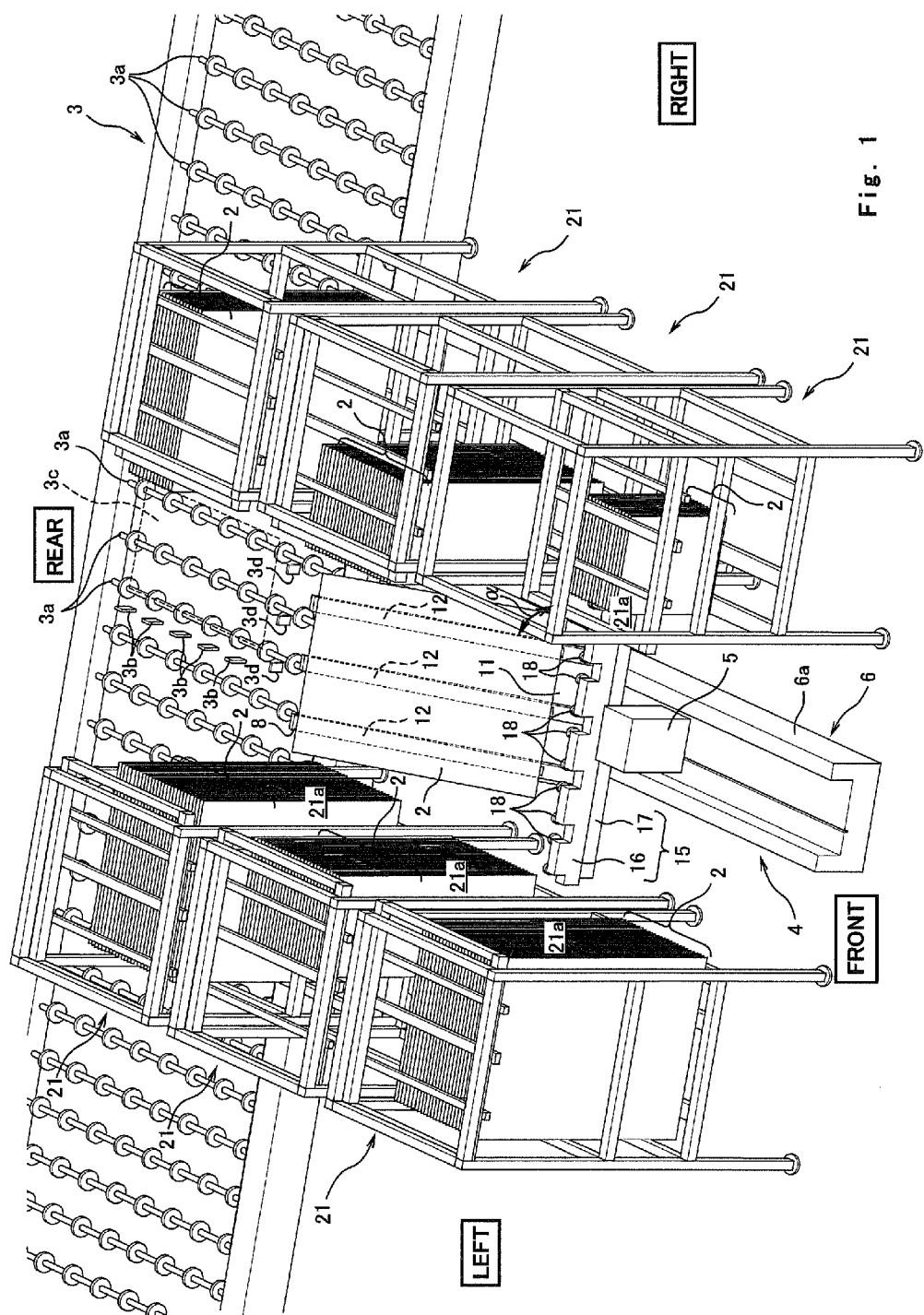
FIG. 1 is a perspective view showing a stocker facility according to an embodiment of the present invention.

As shown in FIG. 1, the stocker facility 1 is a facility provided on a portion of a conveyance path through which plate-shaped members 2 are conveyed from one processing device to another processing device and configured to temporarily store the conveyed plate-shaped members 2. The plate-shaped member 2 is a large-size glass plate used in a solar panel, a liquid crystal panel, or the like. Hereinafter, the plate-shaped member 2 will be explained as a glass plate 2. However, the plate-shaped member 2 is not limited to the large-size glass plate and may be a steel plate, a resin plate, or the like as long as it is a plate-shape member. In the present embodiment, the stocker facility 1 is provided at a wheel conveyor 3 configured to convey the glass plates 2 from one processing device to another processing device.

The wheel conveyor 3 includes a plurality of rotatable wheel axles 3a. Each of the wheel axles 3a extends in a front-rear direction and is rotated by a driving device, not shown. The wheel conveyor 3 is configured to cause the plurality of wheel axles 3a to rotate to cause the glass plate 2, mounted on the wheel axles 3a, to move in one direction (in the present embodiment, a left direction). The wheel conveyor 3 includes downstream stopper members 3b. The downstream stopper members 3b are provided between two adjacent wheel axles 3a so as to be arranged in a line in the front-rear direction and are configured to be projectable. The wheel conveyor 3 is configured to stop the glass plate 2, moving on the wheel conveyor 3, at a stop position by causing the downstream stopper members 3b to project from between the wheel axles 3a and is also configured to allow the movement of the glass plate 2 from the stop position to the downstream side by causing the downstream stopper members 3b to sink between the wheel axles 3a.

Further, the wheel conveyor 3 includes a slide device 3c and a plurality of positioning members 3d, and the positioning of the glass plate 2 may be performed by the slide device 3c and the plurality of positioning members 3d. The slide device 3c is configured to cause the glass plate 2, located at the stop position, to slide in the front-rear direction. The plurality of positioning members 3d are located on the front side of the wheel conveyor 3 to be arranged in a line in a left-right direction, and each positioning member 3d is provided between adjacent wheel axles 3a. The positioning member 3d is configured to be projectable. The glass plate 2 which is caused to slide by the slide device 3c is stopped by causing the positioning members 3d to project from between the wheel axles 3a.

The stocker facility 1 is configured to store the glass plate 2, stopped at the stop position, in a rack 21. As shown in FIG. 1, the stocker facility 1 includes a stocker 4 and the racks 21.

Stocker

Figure 2:
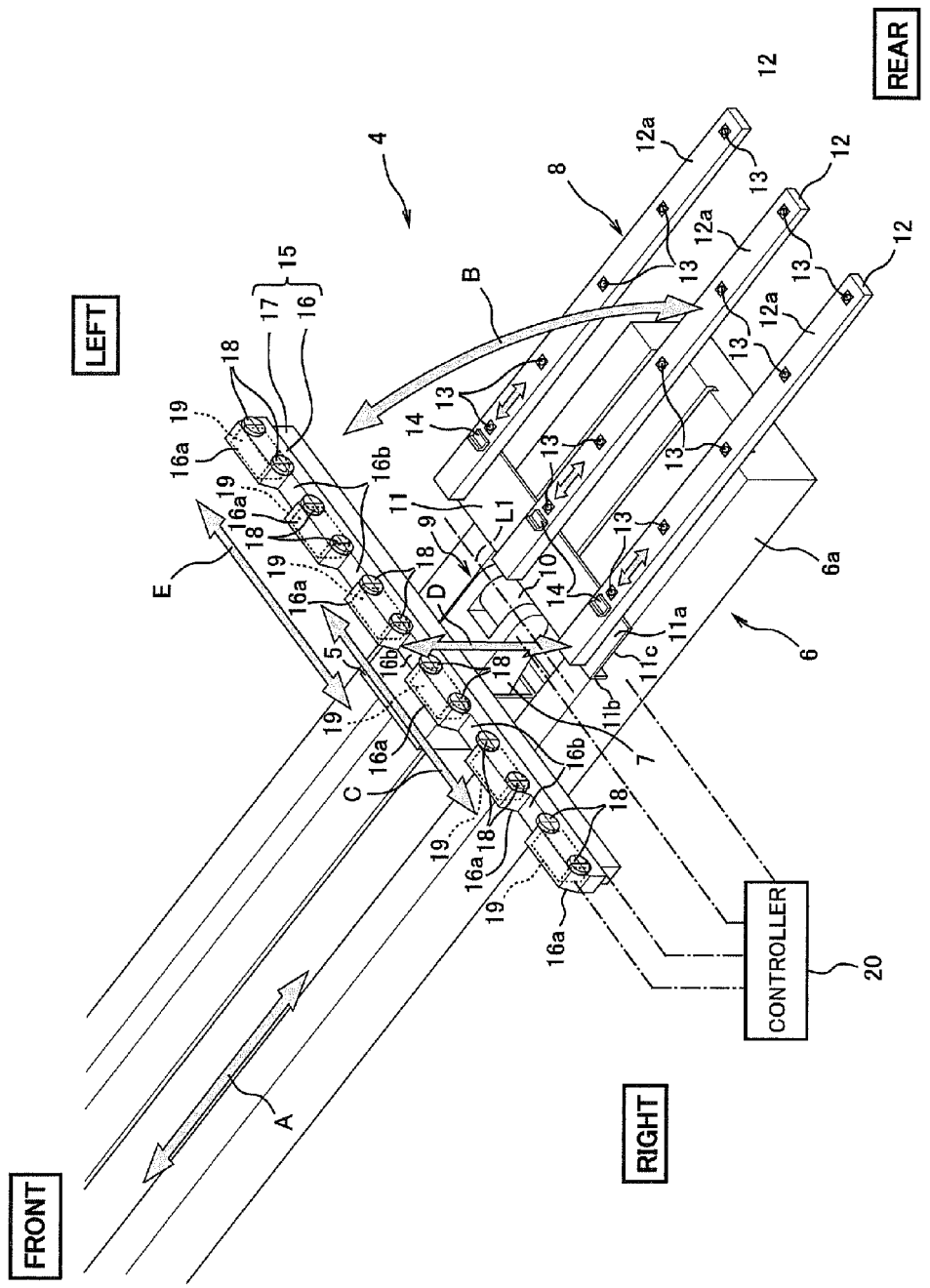
FIG. 2 is an enlarged perspective view showing a stocker included in the stocker facility shown in FIG. 1.

As shown in FIG. 2, the stocker 4 includes a base 5. The base 5 is attached on a base drive mechanism 6 and is configured to be slidable in the front-rear direction by the base drive mechanism 6. The base drive mechanism 6 includes a casing 6a and a drive mechanism (not shown). The casing 6a extends in the front-rear direction, and the drive mechanism constituted by a ball screw mechanism, a servo motor, and the like is stored in the casing 6a. The base drive mechanism 6 configured as above extends in the front direction from the vicinity of the wheel conveyor 3 and is attached to, for example, a floor of the installation location. As described above, the base 5 is attached to the base drive mechanism 6 so as to be slidable (see an arrow A in FIG. 2). The base 5 is formed to have a substantially rectangular solid shape. A hinge lifting mechanism 7 is provided at the base 5. The hinge lifting mechanism 7 is constituted by, for example, a piston mechanism. A hinge 9 is attached to the hinge lifting mechanism 7, and the hinge lifting mechanism 7 is configured to cause the hinge 9 to move upward and downward in the upper-lower direction. A flip 8 serving as a so-called hand or end effector is attached to a rear portion of the base 5 via the hinge 9.

The flip 8 is formed to have a substantially three-forked shape and configured to be able to support the glass plate 2 mounted on the flip 8. The flip 8 is attached to the rear portion of the base 5 via the hinge 9 and configured to be rotatable about a rotation axis line L1 by the hinge 9. A flip drive mechanism 10 is provided at the hinge 9. The flip drive mechanism 10 is, for example, a servo motor and is configured to cause the flip 8 to rotate about the rotation axis line L1 (see an arrow B in FIG. 2). Hereinafter, the configuration of the flip 8 will be explained in detail based on a state where the posture of the flip 8 is substantially horizontal as shown in FIG. 2.

The flip 8 includes a base portion 11 on a base end side (front side). The base portion 11 is a plate-shape member extending in a left-right direction and is attached to the base 5 via the hinge 9. Three supporting plates 12 are attached to an upper surface 11a of the base portion 11. Each of the supporting plates 12 is a plate member extending in the front-rear direction and having a strip shape, and base end sides of the supporting plates are fixed to the base portion 11 so as to be spaced apart from one another at substantially regular intervals in the left-right direction. The interval between the supporting plates 12 corresponds to the interval between the wheel axles 3a of the wheel conveyor 3, and each supporting plate 12 can get into between the adjacent wheel axles 3a. The base portion 11 includes a stopper 11b. The stopper 11b is formed on a lower surface 11c of the base portion 11 so as to extend in the lower direction and is in contact with the casing 6a of the base drive mechanism 6. The stopper 11b has a function of contacting the casing 6a to regulate the rotation of the base portion 11 to the lower side such that tip end sides of the supporting plates 12 do not face the lower direction.

A plurality of spherical rollers 13 (in the present embodiment, five spherical rollers 13) are attached to an upper surface 12a of each of the supporting plates 12. The plurality of spherical rollers 13 are attached to the supporting plate 12 so as to be able to roll and are arranged at intervals in the front-rear direction. A part of each spherical roller 13 projects upward to be exposed from the upper surface 12a of the supporting plate 12. A supporting portion 14 is attached to the upper surface 12a of each supporting plate 12. The supporting portion 14 is provided closer to the base end side of the supporting plate 12 than the spherical rollers 13 and projects upward from the upper surface 12a. A cylinder mechanism, not shown, is provided at the supporting portions 14, and the supporting portions 14 are configured to be movable in the front-rear direction by the cylinder mechanism.

A conveying mechanism 15 is attached to a front portion of the base 5. The conveying mechanism 15 includes a slide member 16. The slide member 16 that is a conveyance body is a plate-shaped member extending in the left-right direction. The slide member 16 is attached to the rear portion of the base 5 via a slide lifting mechanism 17. The slide lifting mechanism 17 is constituted by, for example, a ball screw mechanism and an air pressure cylinder and configured to cause the slide member 16 to slide in the left-right direction (conveying direction) and cause the slide member 16 to move upward and downward in the upper-lower direction (see arrows C and D in FIG. 2). A plurality of convex portions 16a (in the present embodiment, six convex portions 16a) are formed on an upper portion of the slide member 16. The convex portions 16a are arranged in the left-right direction at substantially regular intervals. Each of recesses 16b penetrating the slide member 16 in the front-rear direction is formed between the adjacent convex portions 16a. The recesses 16b are formed such that below-described supporting members 26 of the rack 21 can be respectively inserted in the recesses 16b.

A plurality of driving members 18 are attached to a rear portion of the slide member 16 so as to be scattered. The driving member 18 is constituted by, for example, a roller or a belt. The present embodiment explains a case where the driving member 18 is a roller. Twelve driving members 18 are attached to the slide member 16. Each of the driving members 18 is configured to be rotatable about a rotation axis line parallel to the front-rear direction, and two driving members 18 are attached to each convex portion 16a. Rotation interlocking mechanisms 19 are provided at the slide member 16. Each of the rotation interlocking mechanisms 19 is constituted by a transmission mechanism, such as a timing belt, and a servo motor and is provided in the slide member 16. The rotation interlocking mechanisms 19 are configured to cause a plurality of driving members 18 to rotate in the same direction in conjunction with one another to transfer the glass plate 2, mounted on the driving members 18, in the left or right direction (see an arrow E in FIG. 2).

Figure 3:
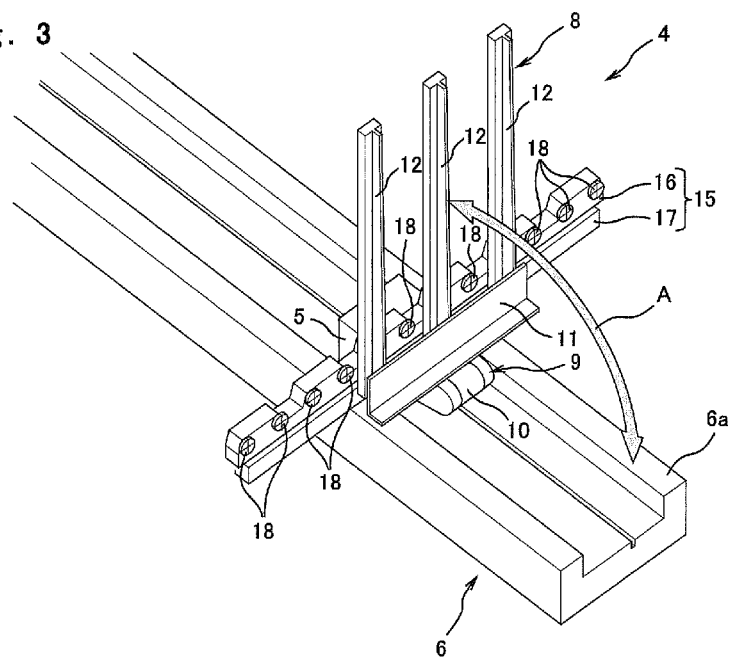
FIG. 3 is a perspective view showing the movement of a flip of the stocker shown in FIG. 2.

The stocker 4 includes a controller 20 configured to control operations of respective components. The controller 20 is connected to the base drive mechanism 6, the hinge lifting mechanism 7, the flip drive mechanism 10, the slide lifting mechanism 17, and the rotation interlocking mechanism 19 via signal wires. The controller 20 has a function of transmitting signals to the mechanisms 6, 7, 10, 15, and 19 based on a prestored program or a command input from an input unit, not shown, to control the operations of the mechanisms 6, 7, 10, 15, and 19. The controller 20 controls the operations of these seven mechanisms 6, 7, 10, 15, and 19 to cause the stocker 4 to achieve below-described functions. Hereinafter, the functions of the stocker 4 will be explained in reference to FIGS. 2 to 4.

The stocker 4 has a function of laying the flip 8 in a horizontal state as shown in FIG. 2, causing the laid flip 8 to move upward by the hinge lifting mechanism 7, and mounting the glass plate 2 on the flip 8. In addition, the stocker 4 can cause the flip 8 to rotate by the hinge 9 (see FIG. 3) to stand the glass plate 2 mounted on the flip 8 or lay the glass plate 2 in a horizontal posture state (horizontal state). Here, the horizontal state denotes not only a completely horizontal state but also a slightly inclined state relative to the completely horizontal state. Further, the stocker 4 has a function of causing the base 5 to move by the base drive mechanism 6 to cause the glass plate 2, mounted on the flip 8, to move in the front-rear direction.

Figure 4:
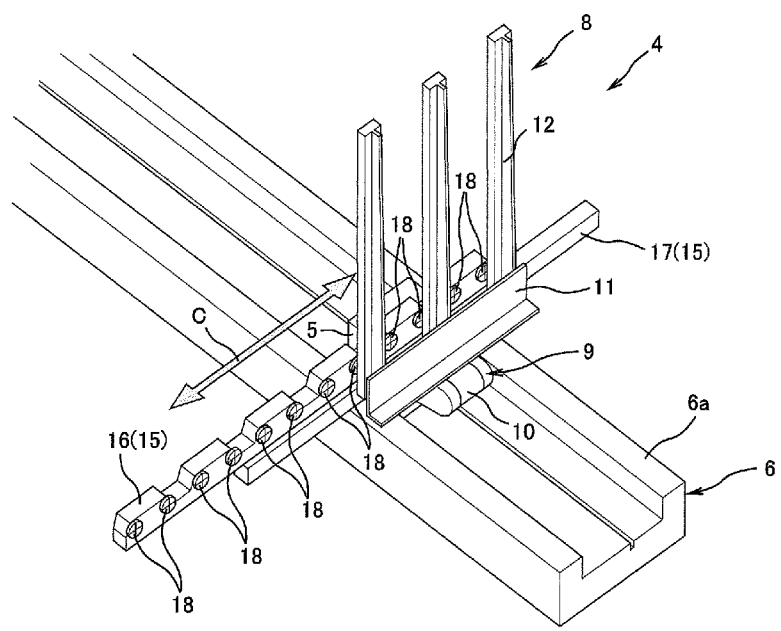
FIG. 4 is a perspective view showing the movement of a slide member of the stocker shown in FIG. 3.

As shown in FIG. 4, the stocker 4 has a function of causing the slide member 16 to slide in the left or right direction and causing the slide member 16 to move upward by the slide lifting mechanism 17. A lower end of the glass plate 2 which has been stood by causing the flip 8 to rotate is supported by the supporting portions 14. The stocker 4 has a function of lowering the supporting portions 14 by a cylinder (not shown) to mount the glass plate 2, supported by the supporting portions 14, on the driving members 18 of the slide member 16. Then, the stocker 4 is configured to cause the plurality of driving members 18 to rotate by the rotation interlocking mechanisms 19 to transfer the glass plate 2 in the left or right direction.

The plurality of racks 21 (in the present embodiment, three racks 21) are arranged on each of the left and right sides of the stocker 4 capable of transferring the glass plate 2 in the left and right directions as above. On each of the left and right sides, the racks 21 are arranged in a line in the front-rear direction. In the present embodiment, three racks 21 are arranged on each of the left and right sides. The configurations of the racks 21 are the same as one another except for the arrangement positions and directions. Hereinafter, only one rack 21 will be explained. Regarding the other racks 21, the same reference signs are used for the same components, and explanations thereof are omitted.

Rack

Figure 5:
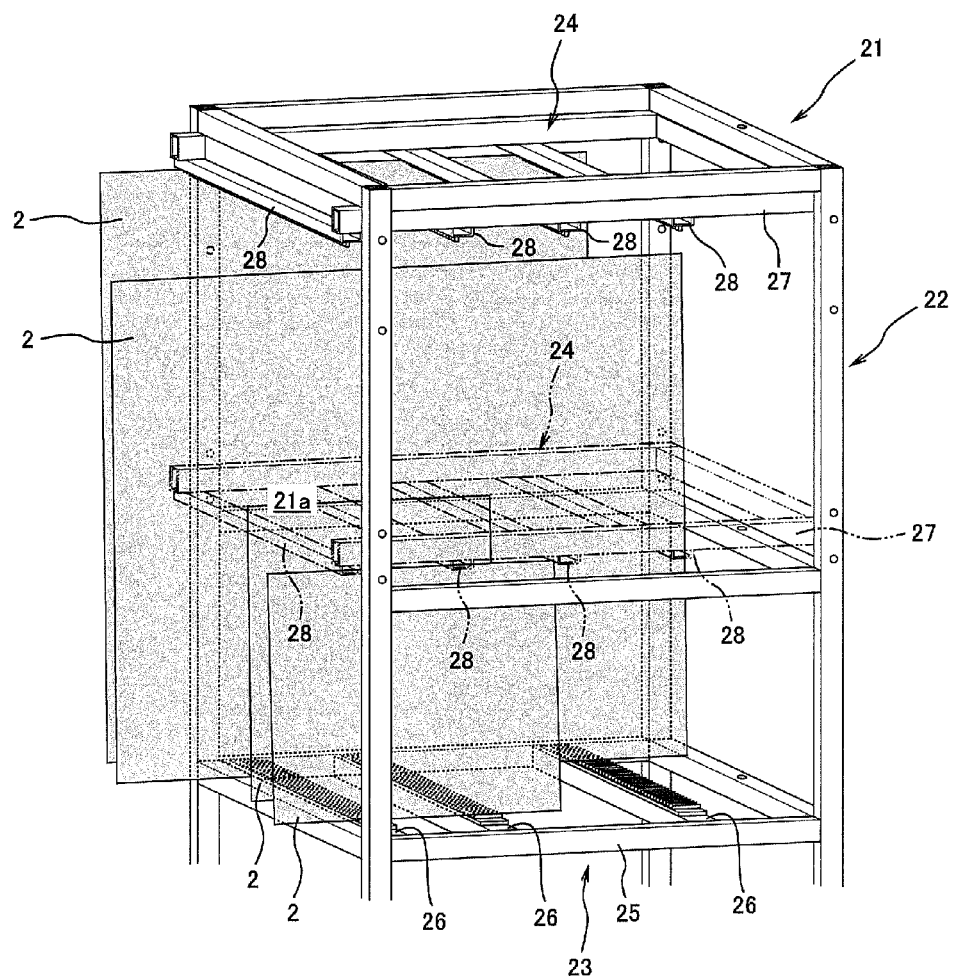
FIG. 5 is an enlarged perspective view showing a rack included in the stocker facility shown in FIG. 1.
Figure 6:
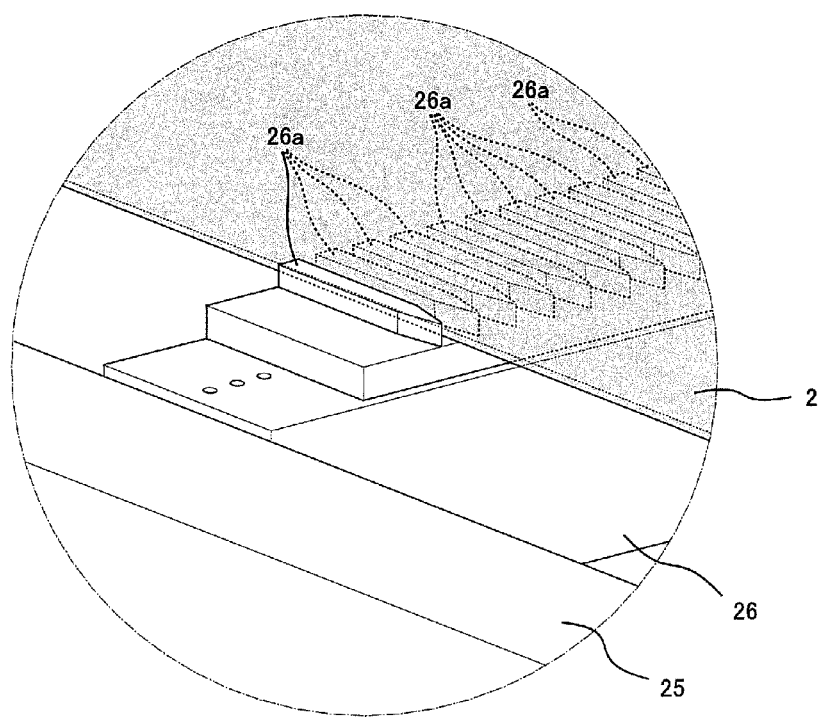
FIG. 6 is an enlarged perspective view showing a part of a lower end side supporting body of the rack shown in FIG. 5.

As shown in FIG. 5, the rack 21 includes a frame 22 assembled to have a rectangular solid shape. A lower end side supporting body 23 is fixed to a lower end side of the frame 22, and an upper end side supporting body 24 is attached to an upper end side of the frame 22. The lower end side supporting body 23 includes an outer frame 25 assembled to have the same rectangular shape as the frame 22 in plan view. A plurality of supporting members 26 (in the present embodiment, three supporting members 26) are fixed to the outer frame 25. Each of the supporting members 26 extends in the front-rear direction to connect members located on the front and rear sides of the outer frame 25. The plurality of supporting members 26 are arranged in the outer frame 25 so as to be spaced apart from one another in the left-right direction, and the interval therebetween is set in accordance with the width of the glass plate 2 to be stored. The supporting member 26 includes a plurality of separators 26a on an upper surface thereof as shown in FIG. 6. The plurality of separators 26a are arranged at substantially regular intervals in the front-rear direction, and the interval between two adjacent separators 26a is slightly wider than the thickness of the glass plate 2.

Figure 7:
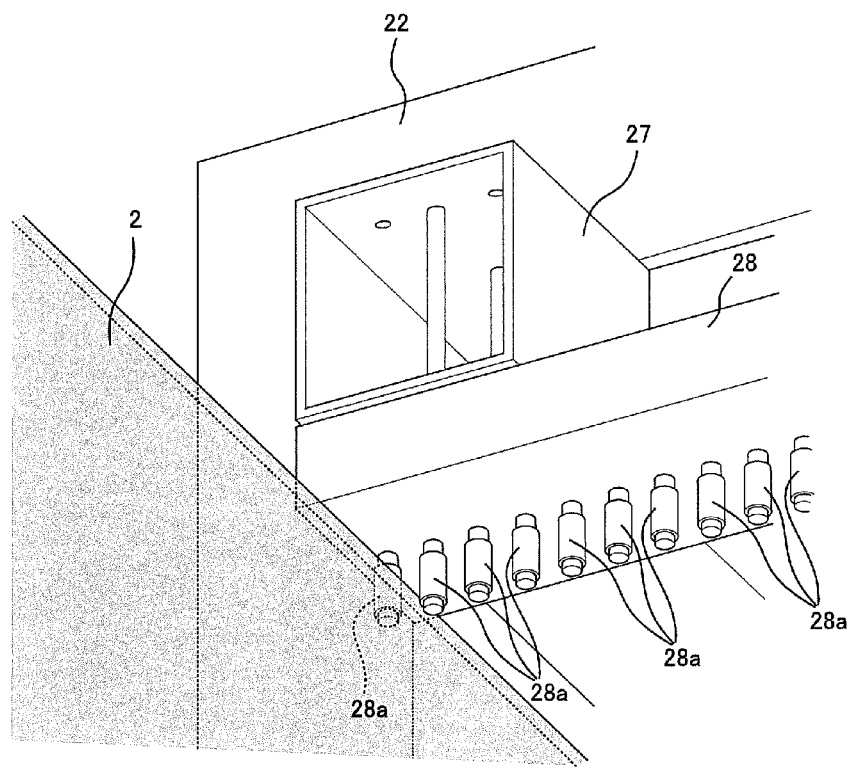
FIG. 7 is an enlarged perspective view showing a part of an upper end side supporting body of the rack shown in FIG. 5.

The upper end side supporting body 24 includes a roof frame 27 assembled to have the same rectangular shape as the frame 22 in plan view. A plurality of beam members 28 (in the present embodiment, four beam members 28) are fixed to the roof frame 27. Each of the beam members 28 extends in the front-rear direction to connect members located on the front and rear sides of the roof frame 27. The plurality of beam members 28 are arranged so as to be spaced apart from one another in the left-right direction, and the interval therebetween is set in accordance with the width of the glass plate 2 to be stored. A plurality of guide rollers 28a are attached to each of lower surfaces of the beam members 28 as shown in FIG. 7. The plurality of guide rollers 28a are provided so as to correspond to the separators 26a and are arranged at substantially regular intervals in the front-rear direction. Each of the guide rollers 28a configured as above is attached to the beam member 28 so as to be rotatable about a rotation axis line extending in the upper-lower direction.

The glass plate 2 is stored in the rack 21 such that the lower end side of the glass plate 2 is inserted between two adjacent separators 26a, and the upper end side of the glass plate 2 is inserted between two adjacent guide rollers 28a. With this, the glass plate 2 is stored so as to stand between the lower end side supporting body 23 and the upper end side supporting body 24 and is supported by the separators 26a and the guide rollers 28a so as not to fall. The upper end side of the glass plate 2 stored as above is inserted between two guide rollers 28a located on a slightly rear side of the guide rollers 28a located immediately above two separators 26a between which the lower end side of the glass plate 2 is placed. Thus, the glass plate 2 is stored in the rack 21 in a slightly rearward inclined state. Each glass plate 2 is placed between two separators 26a and between two guide rollers 28a, and adjacent glass plates 2 are spaced apart from each other by the separator 26a and the guide roller 28a. With this, the glass plates 2 are prevented from contacting each other, separated from each other, and stored in the rack 21 so as to be arranged in the front-rear direction (arrangement direction).

The rack 21 capable of storing the plurality of glass plates 2 as above is configured such that the upper end side supporting body 24 is not fixed to the frame 22, and the height of the upper end side supporting body 24 is adjustable. A lifting mechanism, such as a ball screw mechanism, not shown, is used as an adjustment mechanism configured to adjust the position of the upper end side supporting body 24. The upper end side supporting body 24 may be configured to be manually adjustable without using the lifting mechanism. By adjusting the height of the upper end side supporting body 24 by the adjustment mechanism in accordance with the height of the glass plate 2 to be stored, each rack 21 can change the height of a space in which the glass plates 2 are stored.

In the present embodiment, the height of the upper end side supporting body 24 is adjusted in advance in accordance with the height of the glass plate 2 to be stored. The glass plates 2 stored in the rack 21 located foremost in each line are lower in height than the glass plates 2 stored in the other racks 21 (see the upper end side supporting body 24 shown by a chain double-dashed line in FIG. 5). Therefore, the position of the upper end side supporting body 24 of the rack 21 located foremost is lower than each of the positions of the upper end side supporting bodies 24 of the other racks 21. As above, the rack 21 can adjust the height of the upper end side supporting body 24 in accordance with the height of the glass plate 2 to be stored.

Figure 8:
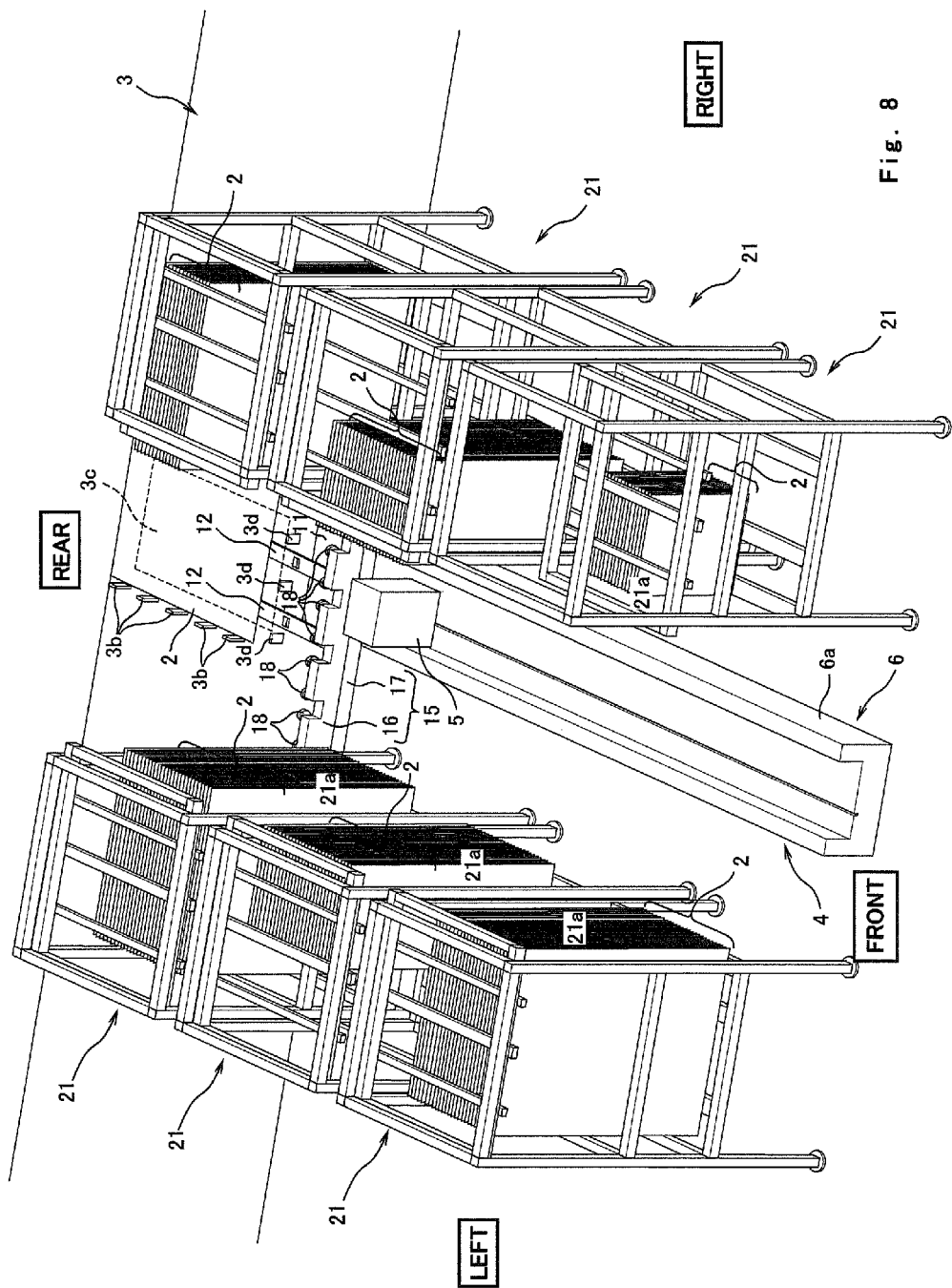
FIG. 8 is a perspective view showing a state where a glass plate conveyed by a wheel conveyor is stopped by downstream stoppers in the stocker facility shown in FIG. 1.
Figure 9:
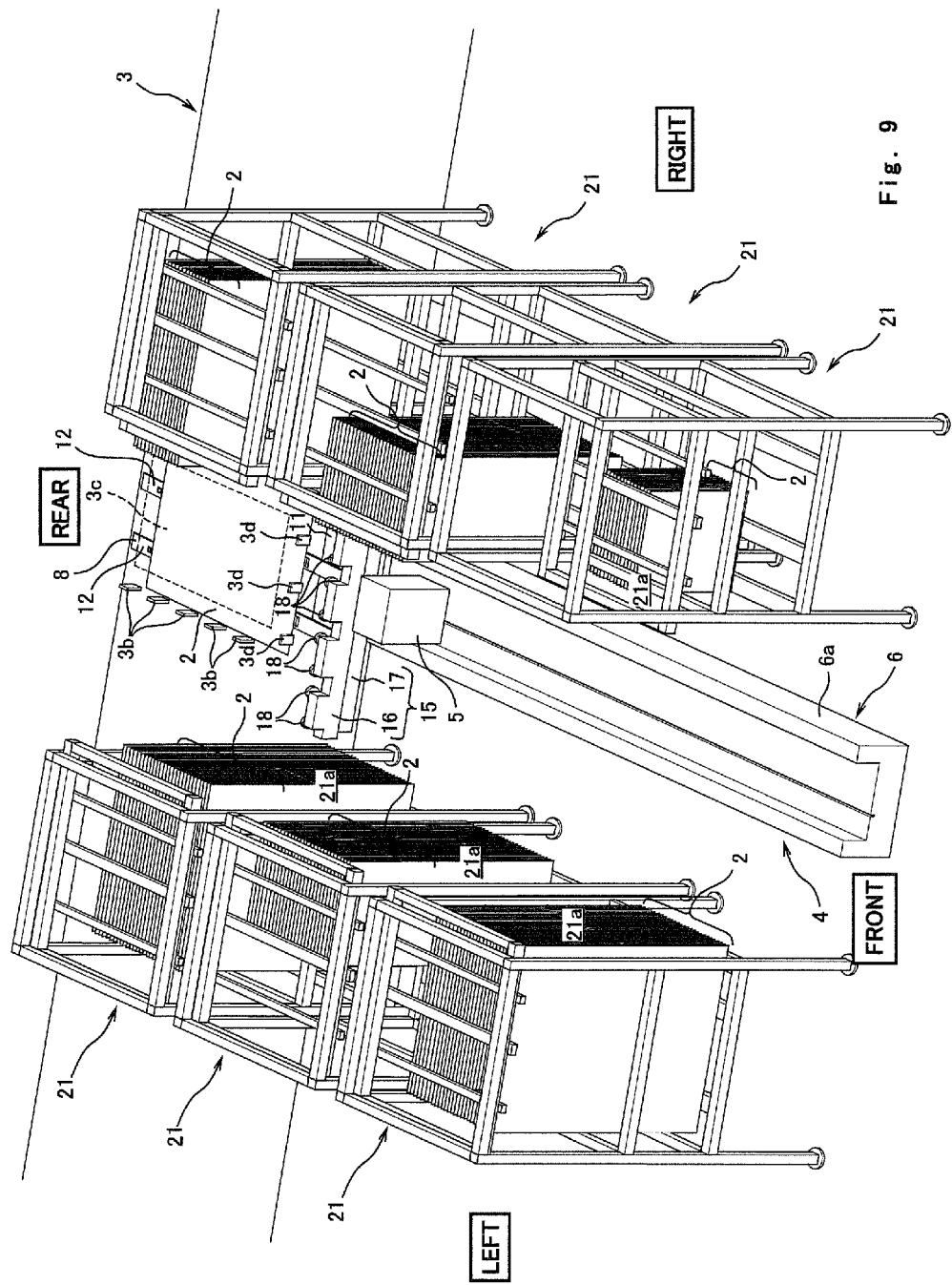
FIG. 9 is a perspective view showing a state where the plate-shaped member has been transferred forward by a slide device from the state of FIG. 8.

The rack 21 configured as above includes an insertion opening 21a through which the glass plate 2 is inserted, the insertion opening 21a being located on one of the left and right sides of the rack 21. Specifically, regarding the rack 21 arranged on the left side of the stocker 4, the insertion opening 21a is formed on the right side of the rack 21. Regarding the rack 21 arranged on the right side of the stocker 4, the insertion opening 21a is formed on the left side of the rack 21. To be specific, the insertion opening 21a opens toward the stocker 4. The stocker 4 is configured to transfer and receive the glass plate 2 to and from the rack 21 through the insertion opening 21a configured as above. Hereinafter, the operations of the stocker 4 configured to store in the rack 21 the glass plate 2 moving on the wheel conveyor 3 will be explained in reference to FIGS. 1, 2, and 8 to 20. In FIG. 8 and subsequent drawings, the wheel axles 3a are omitted.

Operation of Storing Glass Plate

Before receiving the glass plate 2 moving on the wheel conveyor 3, the controller 20 first controls the operation of the base drive mechanism 6 to cause the base 5 of the stocker 4 to move to the vicinity of the wheel conveyor 3. After the movement of the base 5, the controller 20 controls the operation of the flip drive mechanism 10 to lay the flip 8 toward the rear side. After the flip 8 is laid in a horizontal posture, the controller 20 controls the operation of the hinge lifting mechanism 7 to cause the flip 8 to move downward and inserts each of three supporting plates 12 of the flip 8 between the wheel axles 3a. At this time, the flip 8 is moved downward such that the spherical rollers 13 are flush with or lower in position than the rollers of the wheel axles. In order to stop the moving glass plate 2 at a predetermined position on the flip 8, the wheel conveyor 3 causes the downstream stopper members 3b to project upward. Then, the stocker 4 waits until the glass plate 2 moving on the wheel conveyor 3 reaches the predetermined position.

The wheel conveyor 3 stops the glass plate 2, moving on the wheel conveyor 3, above the flip 8 by the downstream stopper members 3b (see FIG. 8). At this time, if the position of the glass plate 2 is on the rear side relative to the predetermined position, the wheel conveyor 3 may selectively use the slide member 3c and the positioning members 3d. To be specific, the positioning members 3d are caused to project, and then the wheel conveyor 3 causes the glass plate 2 to move toward the positioning members 3d, that is, toward the front side by the slide device 3c (see FIG. 9). With this, the glass plate 2 can be surely positioned at the predetermined position.

When the glass plate 2 reaches the predetermined position as above, the controller 20 causes the flip 8 to move upward by the hinge lifting mechanism 7 to mount the glass plate 2 on the flip 8. After the glass plate 2 is mounted on the flip 8, the controller 20 causes the supporting portions 14 to move rearward by the cylinder and contact the glass plate 2. After the supporting portions 14 contact the glass plate 2, the controller 20 causes the flip 8 to rotate by an angle α (see FIG. 1) by the flip drive mechanism 10. With this, the flip 8 in the horizontal state is caused to stand by the angle α, and the glass plate 2 is mounted on the supporting portion 14 and prevented from slipping down from the flip 8. The angle α is set to an inclination angle at which the flip 8 at least separates from (is located above) the wheel conveyor 3.

Figure 10:
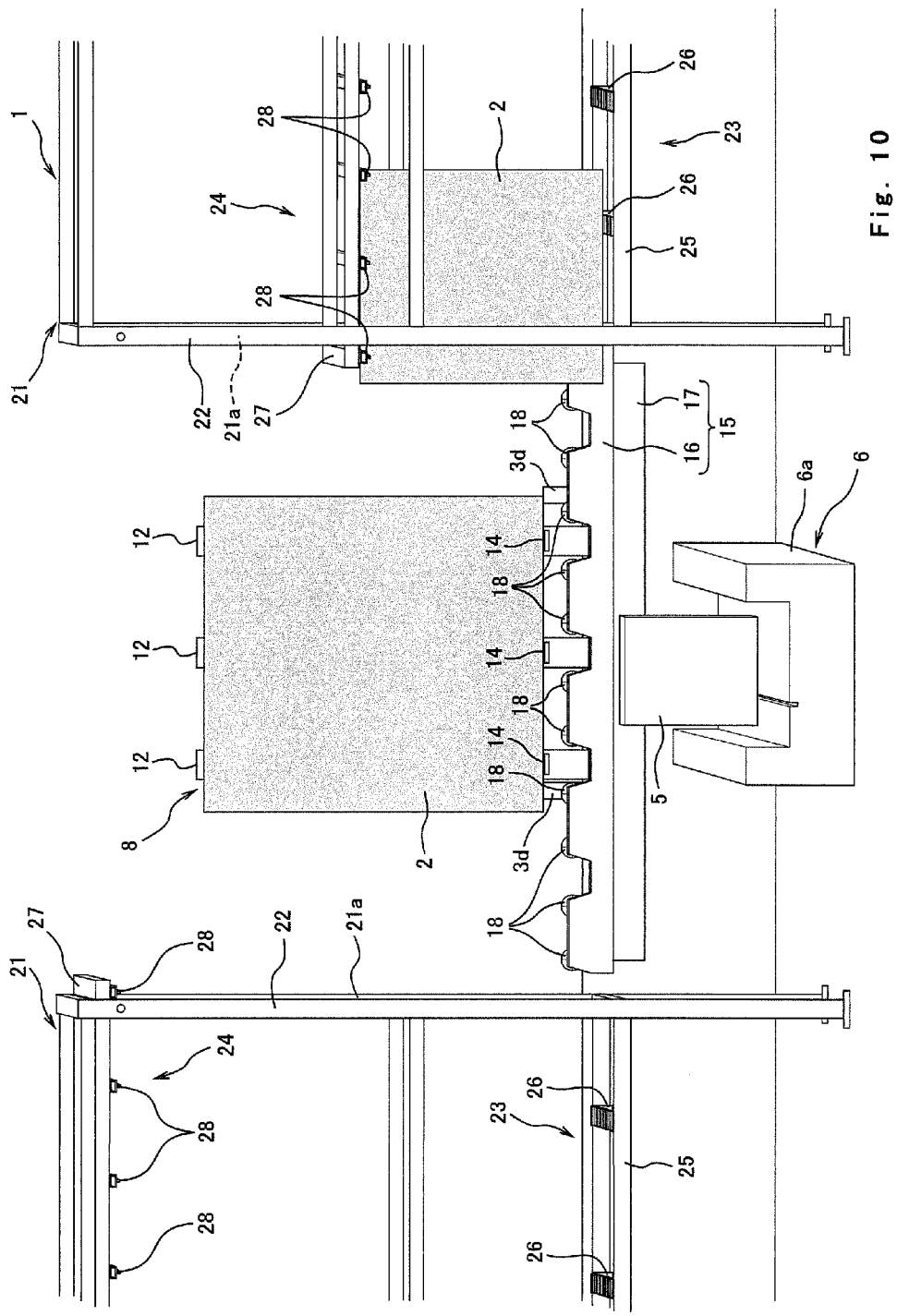
FIG. 10 is a front view showing a state where the flip has been stood from the state of FIG. 9.
Figure 11:
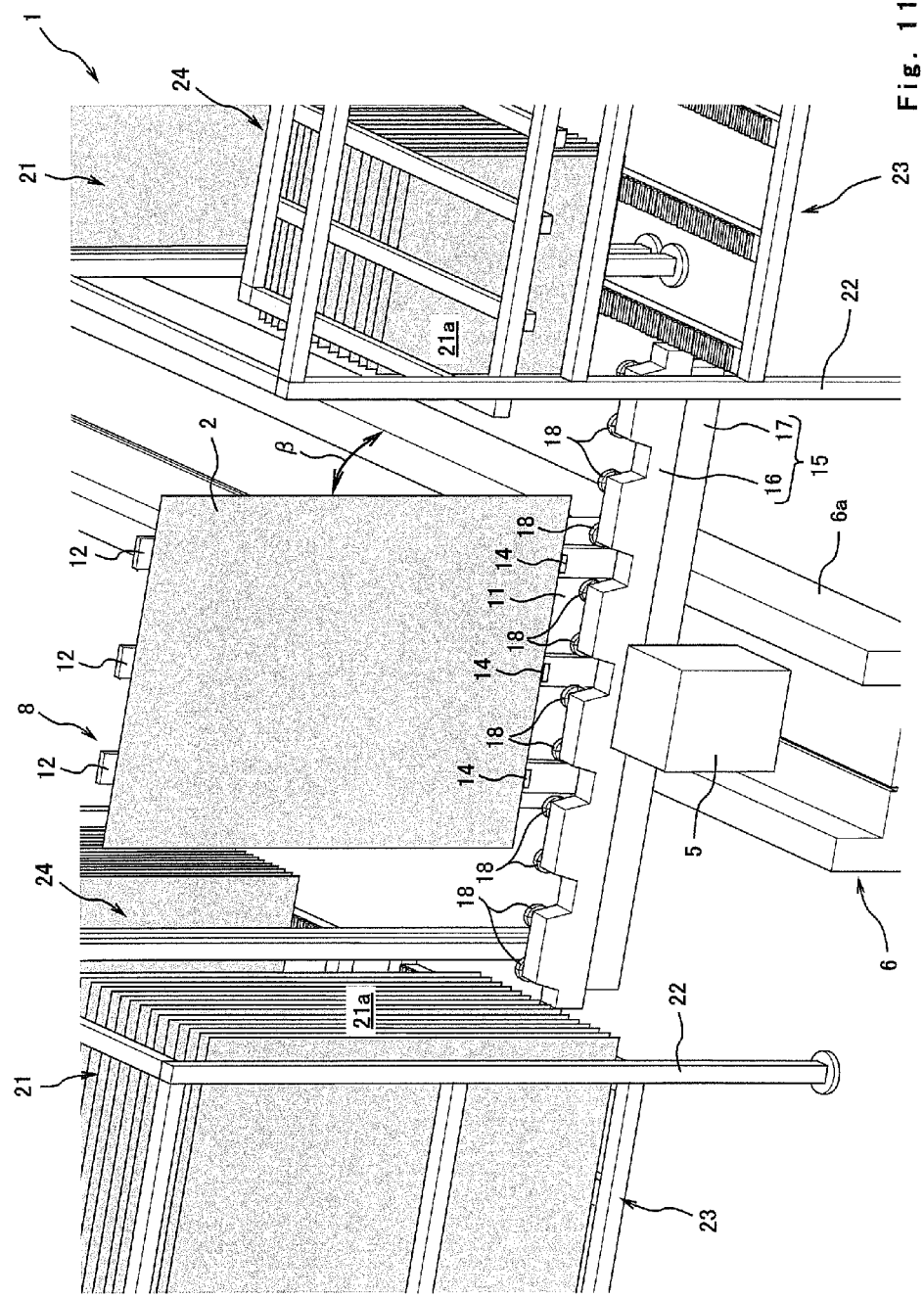
FIG. 11 is an enlarged perspective view showing a state where the stocker has been moved to the front of a storage position of the rack from the state of FIG. 10.
Figure 12:
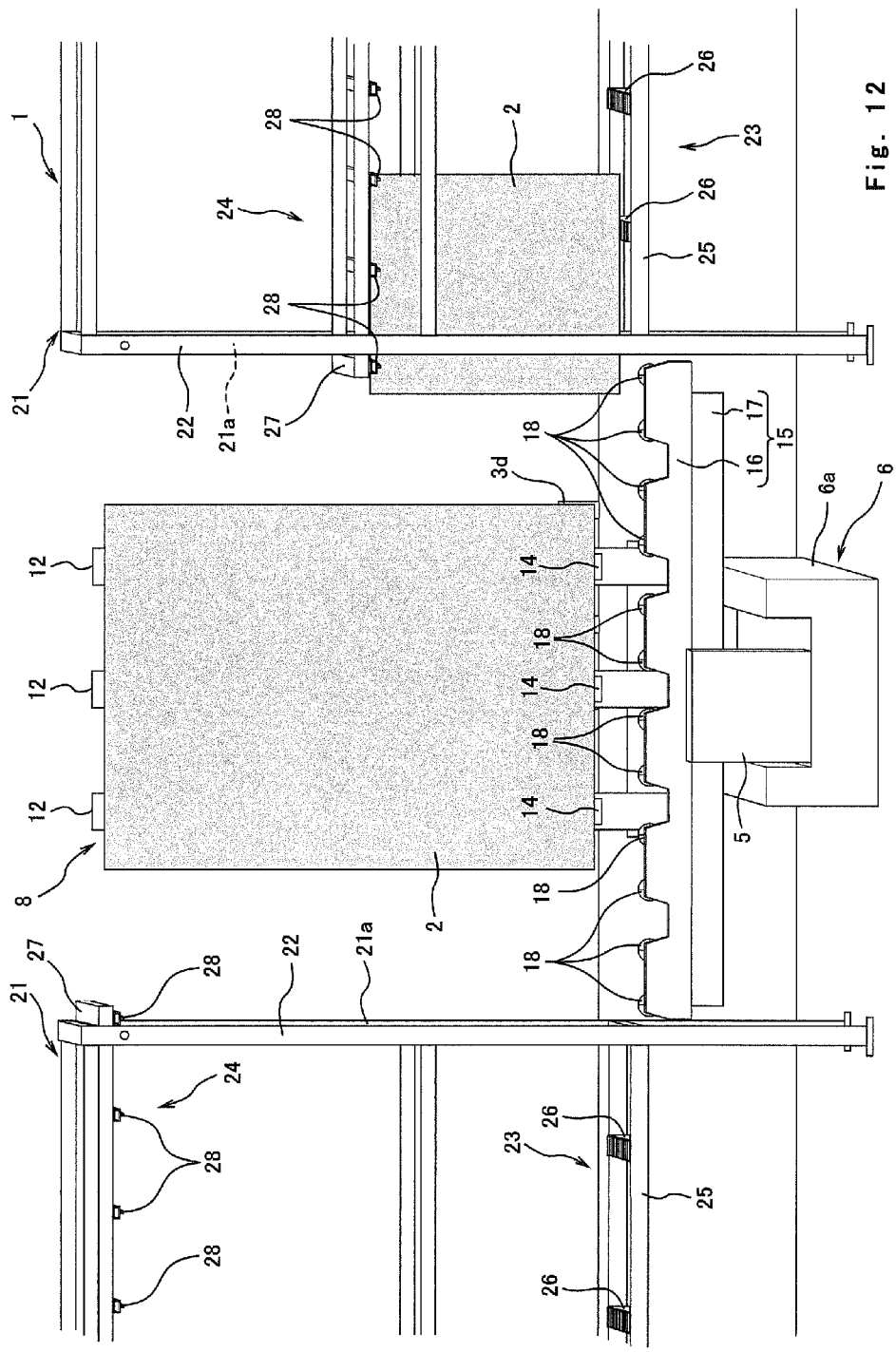
FIG. 12 is a front view of the stocker facility in the state of FIG. 11 when viewed from the front.
Figure 13:
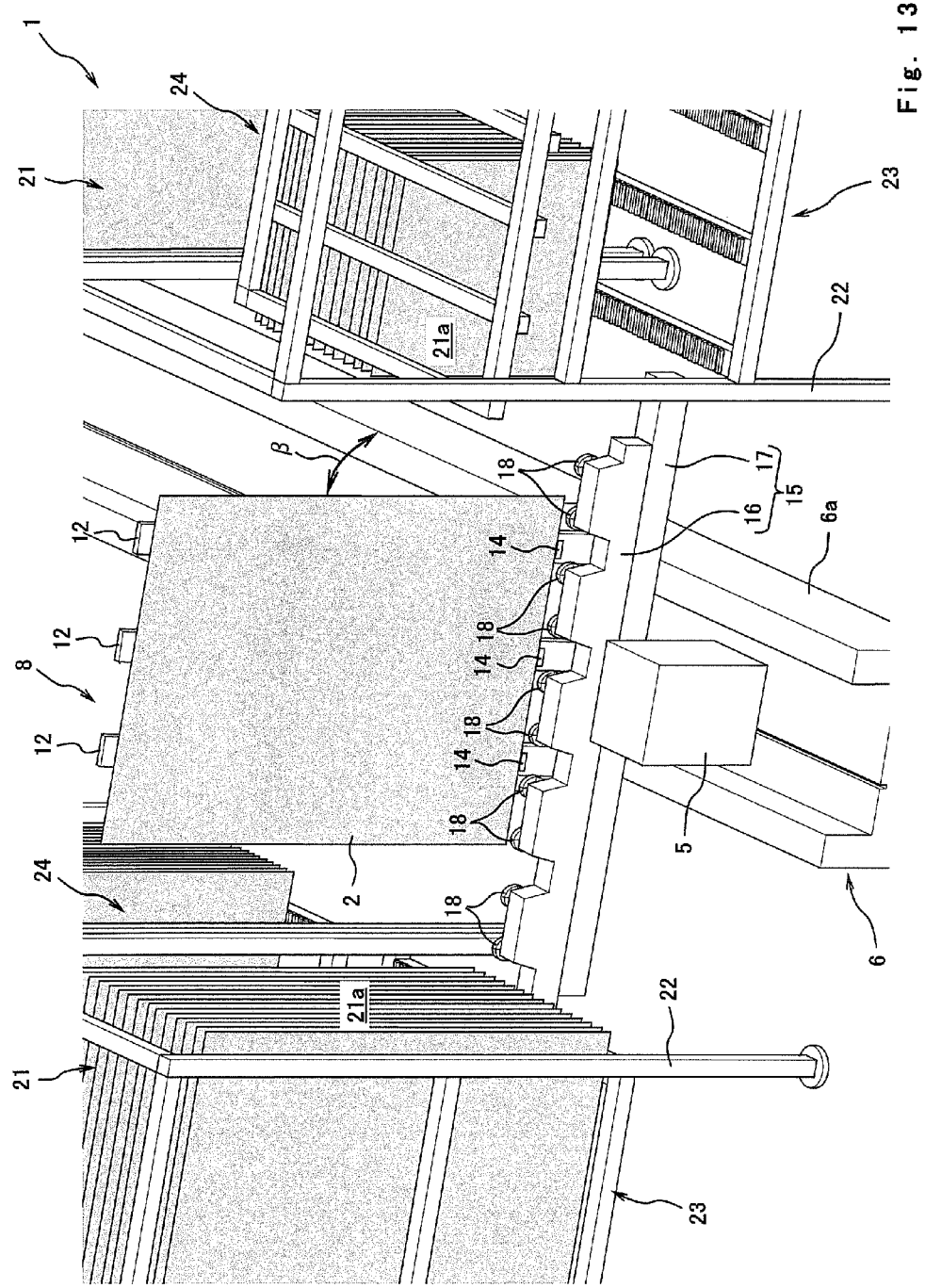
FIG. 13 is an enlarged perspective view showing a state where a part of the slide member has been caused to get into under a left rack from the state of FIG. 11.
Figure 14:
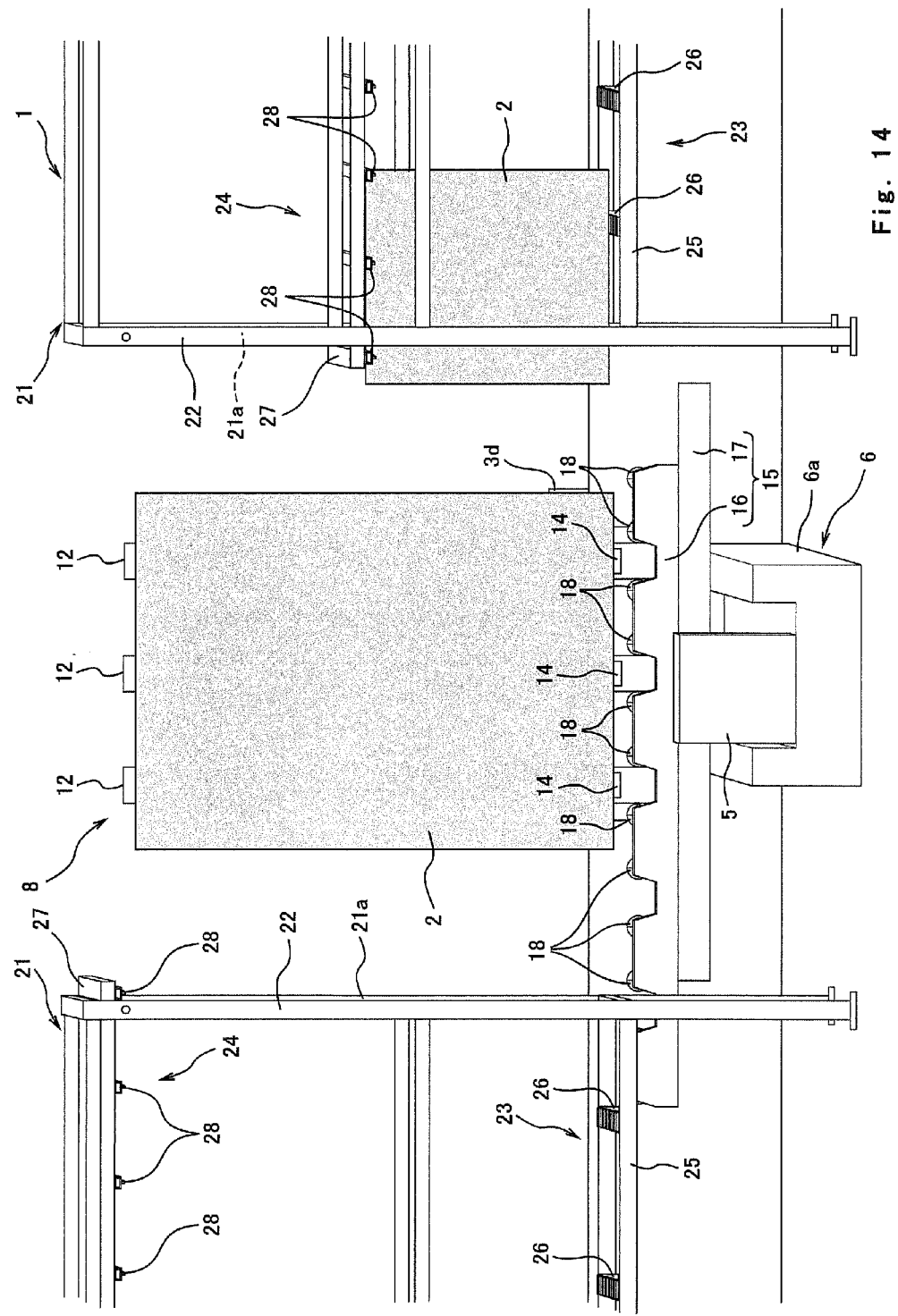
FIG. 14 is a front view of the stocker facility in the state of FIG. 13 when viewed from the front.
Figure 15:
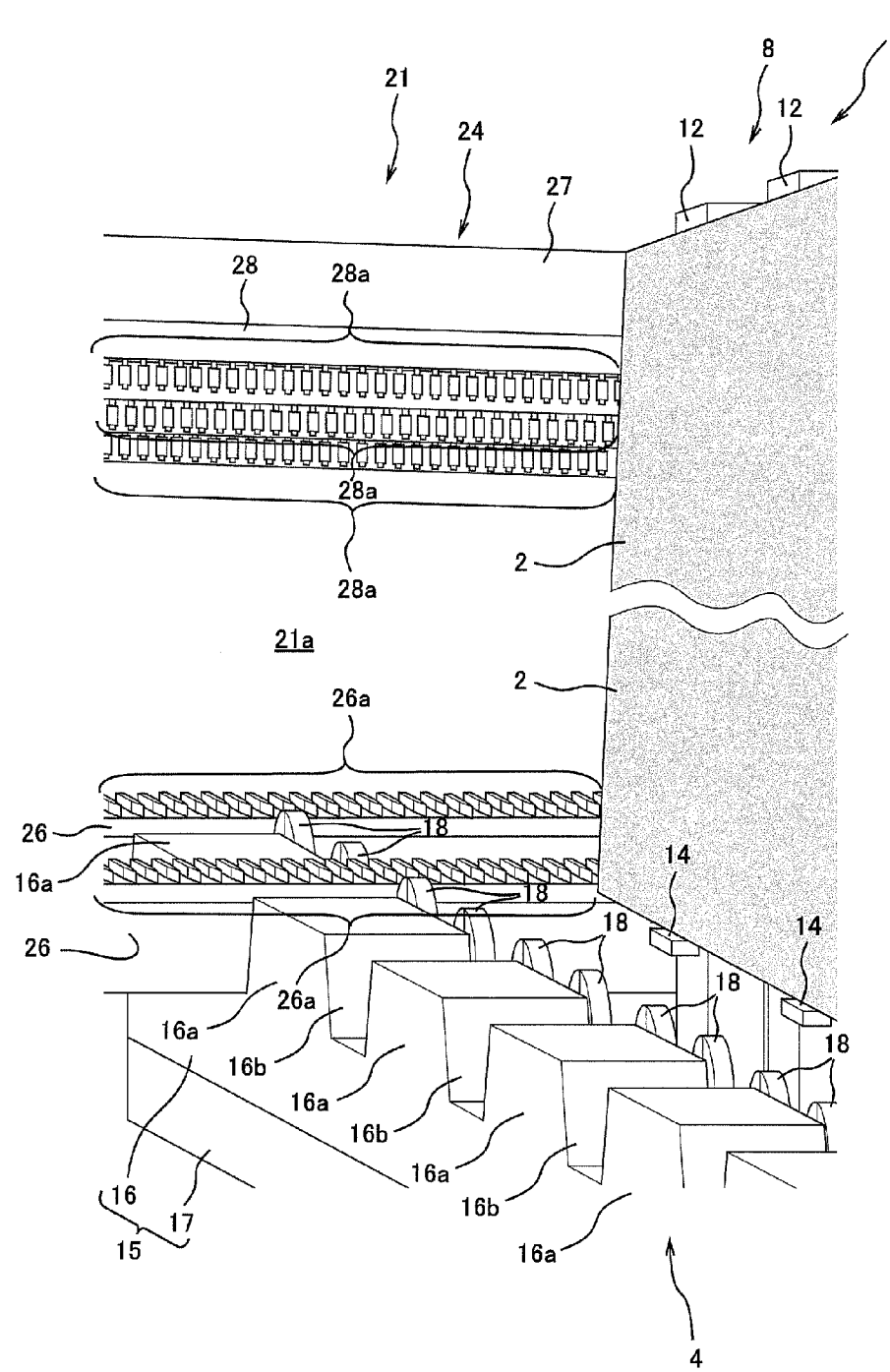
FIG. 15 is an enlarged perspective view showing a state where the slide member has been moved upward from the state of FIG. 13 to be placed between the rack and the flip, when viewed from the right side.
Figure 16:
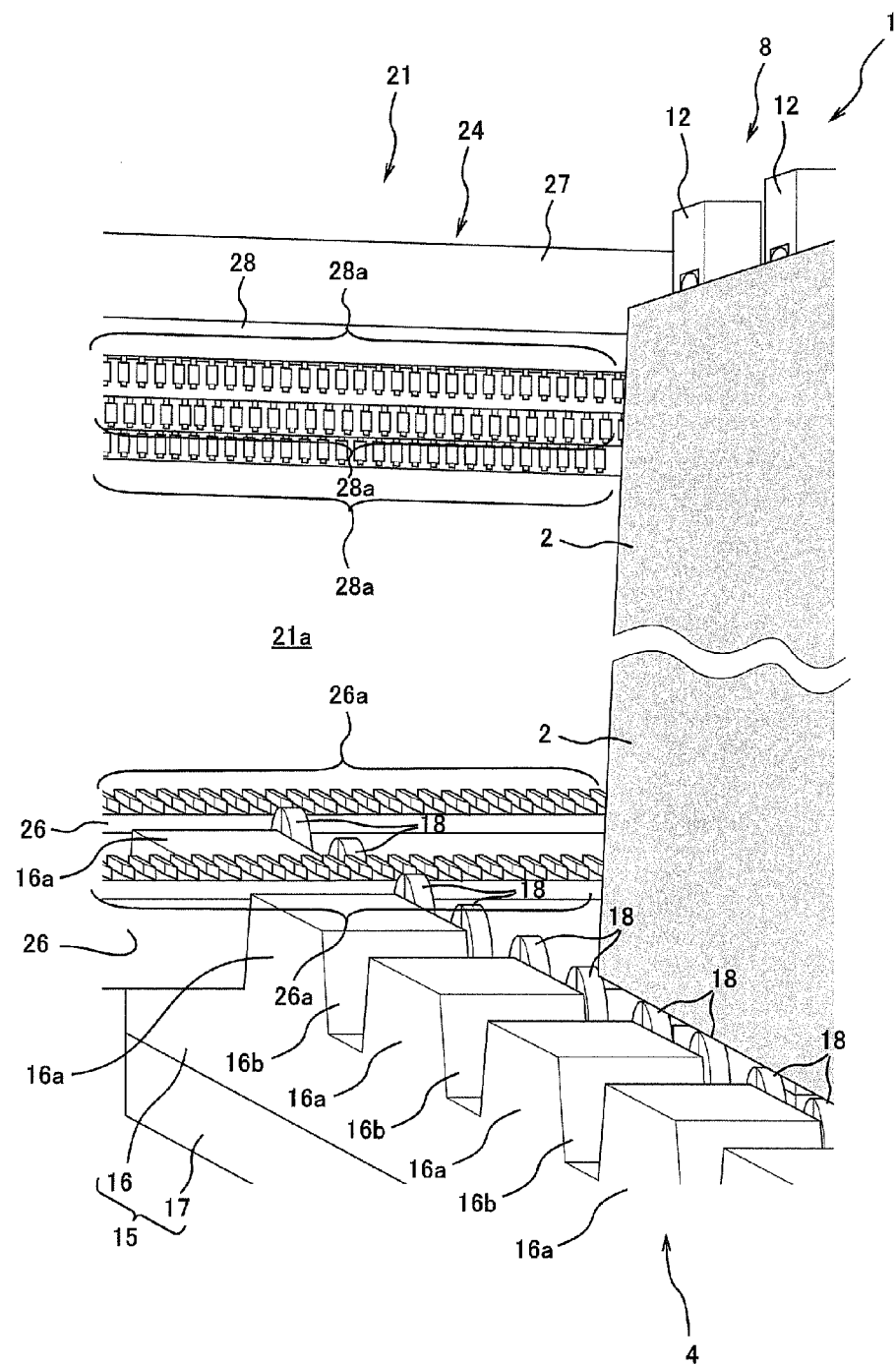
FIG. 16 is an enlarged perspective view showing a state where supporting portions are moved downward from the state of FIG. 15, and the glass plate has been mounted on driving members, when viewed from the right side.
Figure 17:
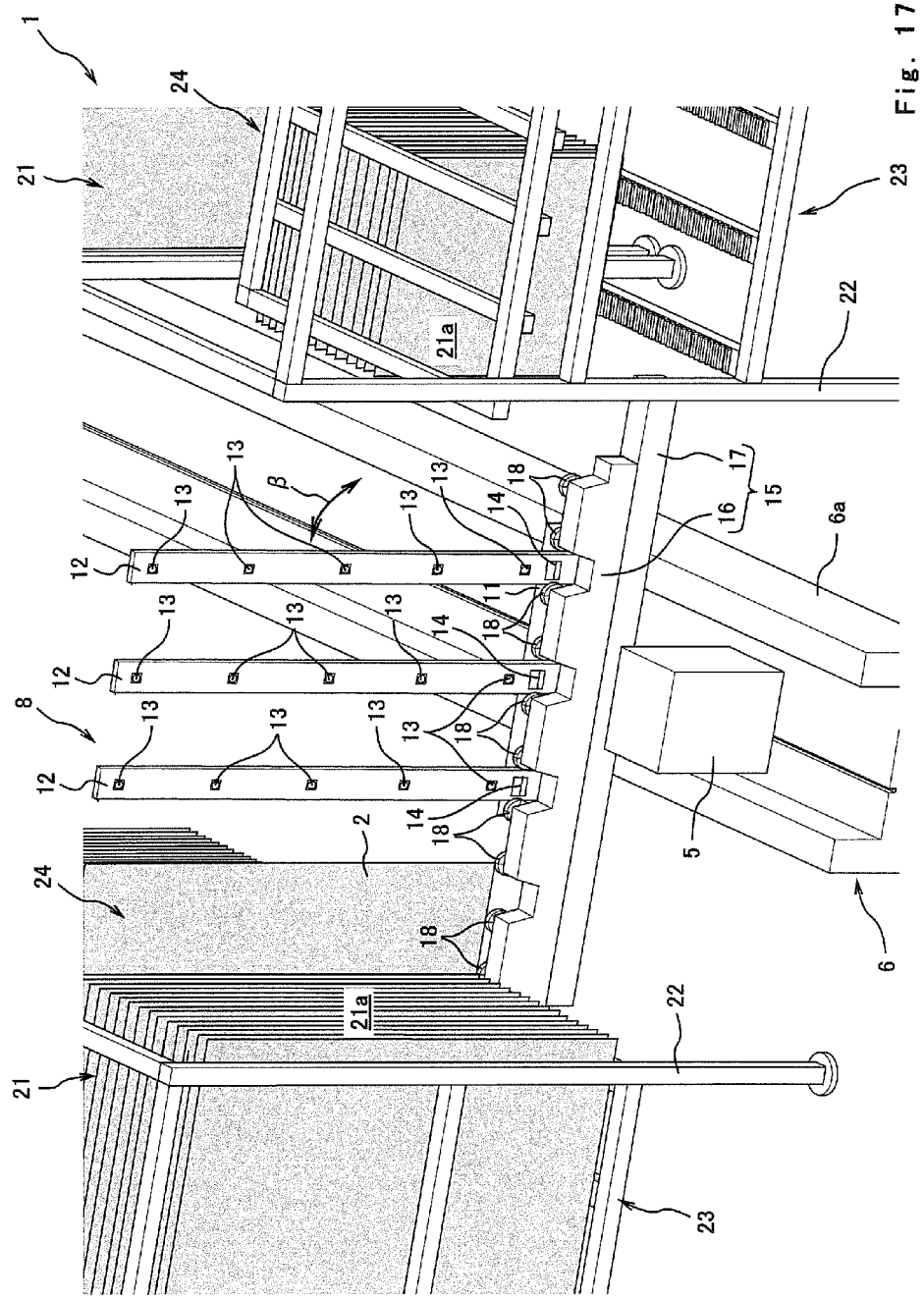
FIG. 17 is an enlarged perspective view showing a state where the driving members has been caused to rotate from the state of FIG. 16 to cause the glass plate to slide.
Figure 18:
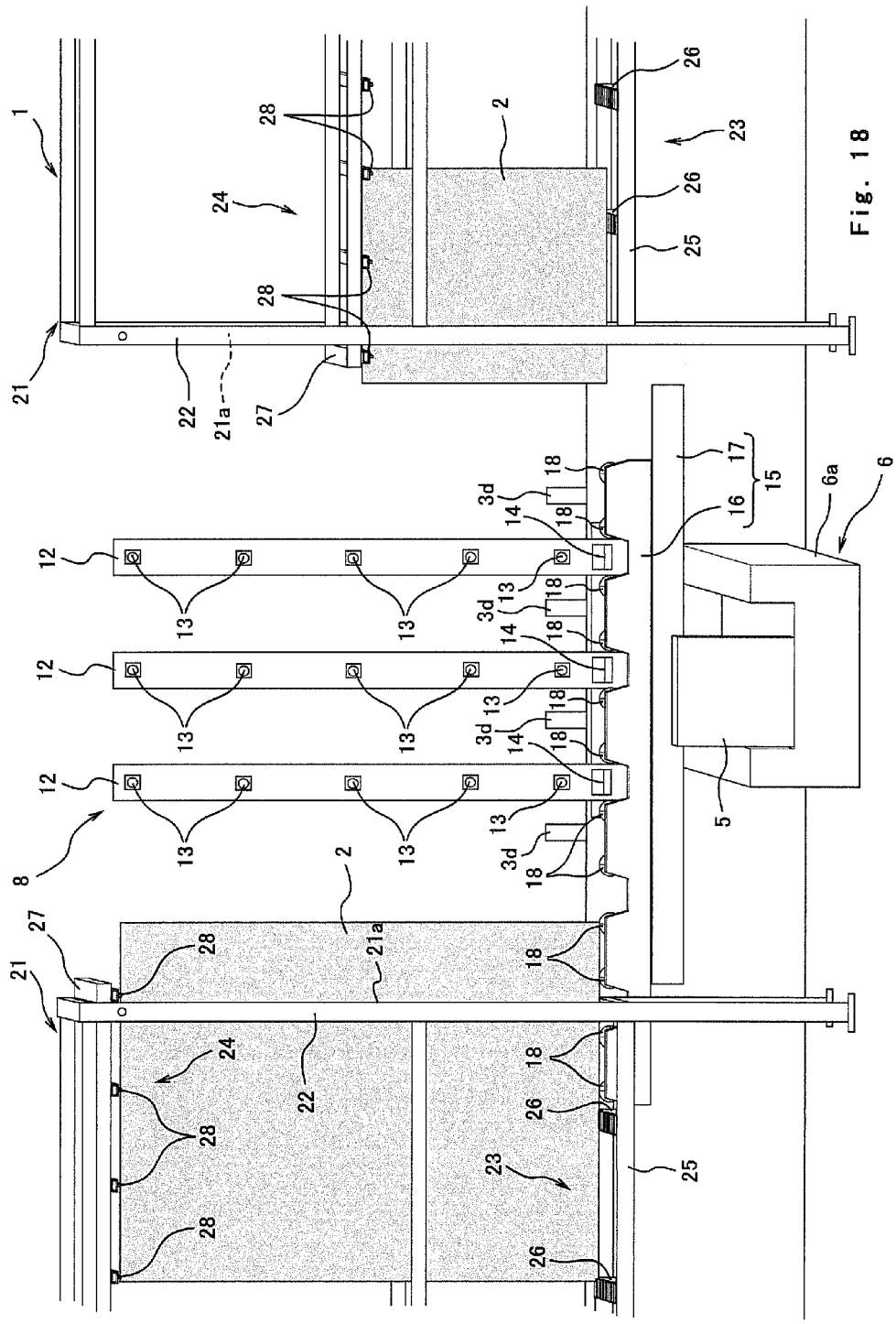
FIG. 18 is a front view of the stocker facility in the state of FIG. 17 when viewed from the front.
Figure 19:
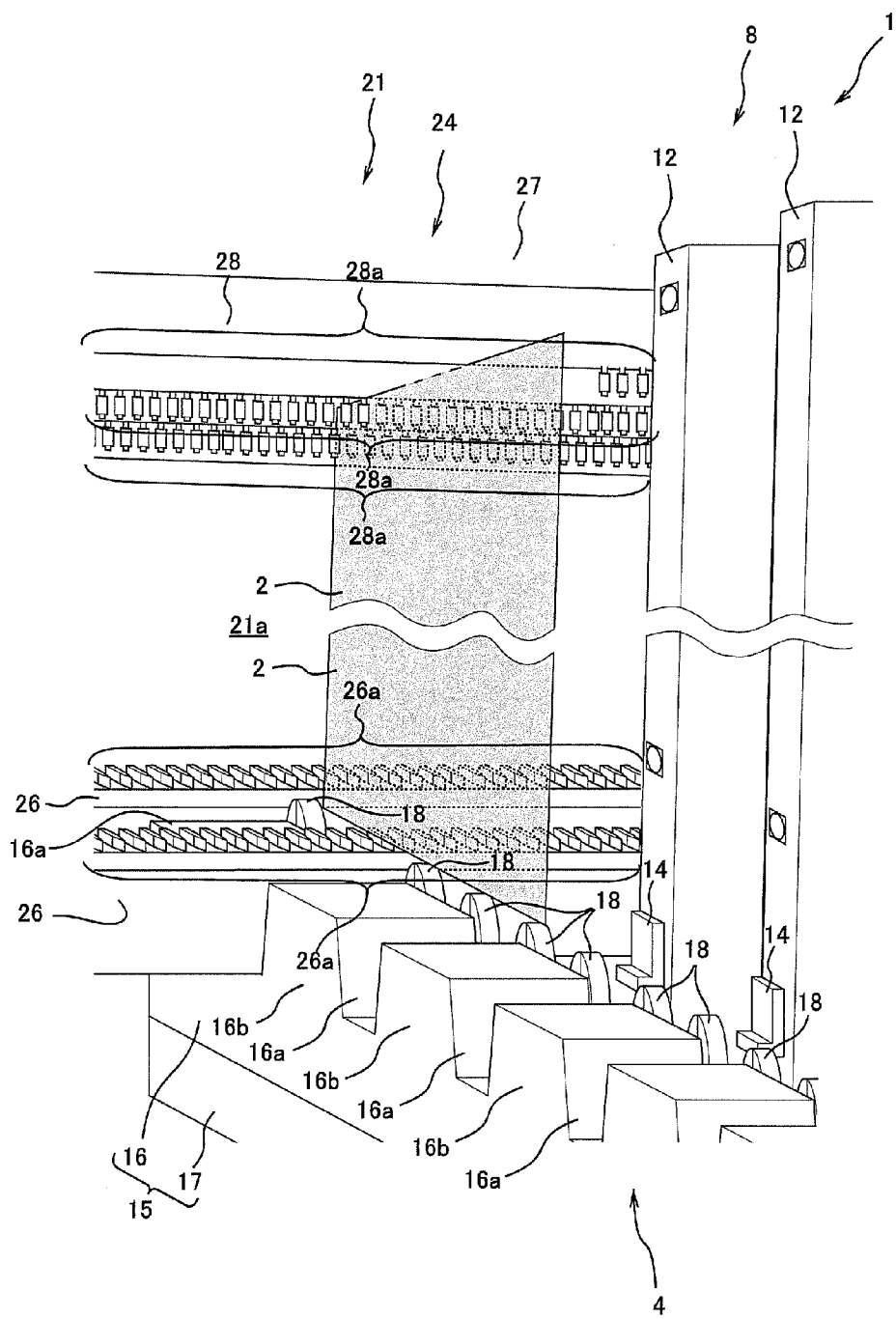
FIG. 19 is an enlarged perspective view of the stocker facility in the state of FIG. 17 when viewed from the right side.
Figure 20:
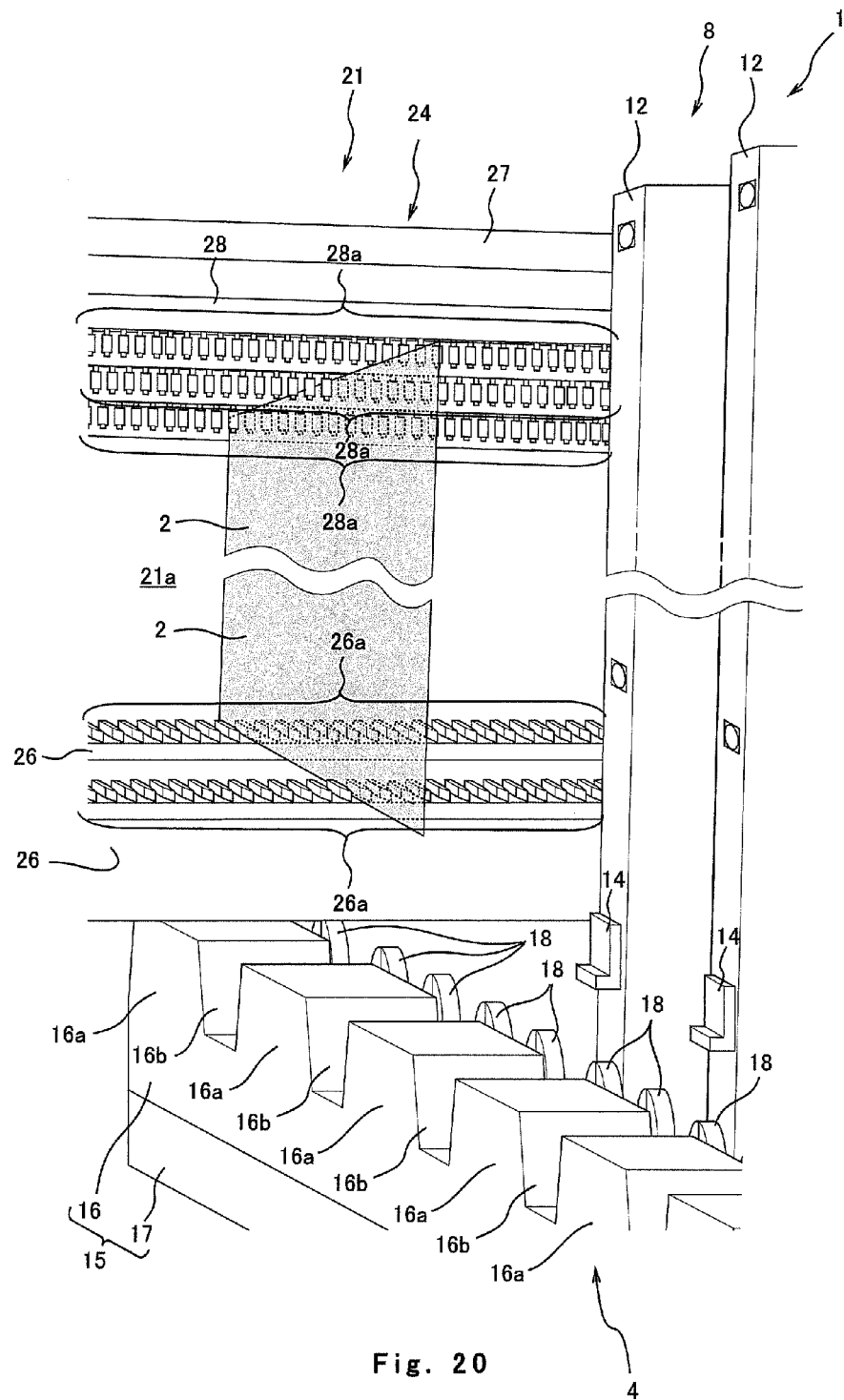
FIG. 20 is an enlarged perspective view showing a state where the glass plate has been caused to further slide from the state of FIG. 17 to be stored in the rack, and the slide member has been moved downward, when viewed from the right side.
Figure 21:
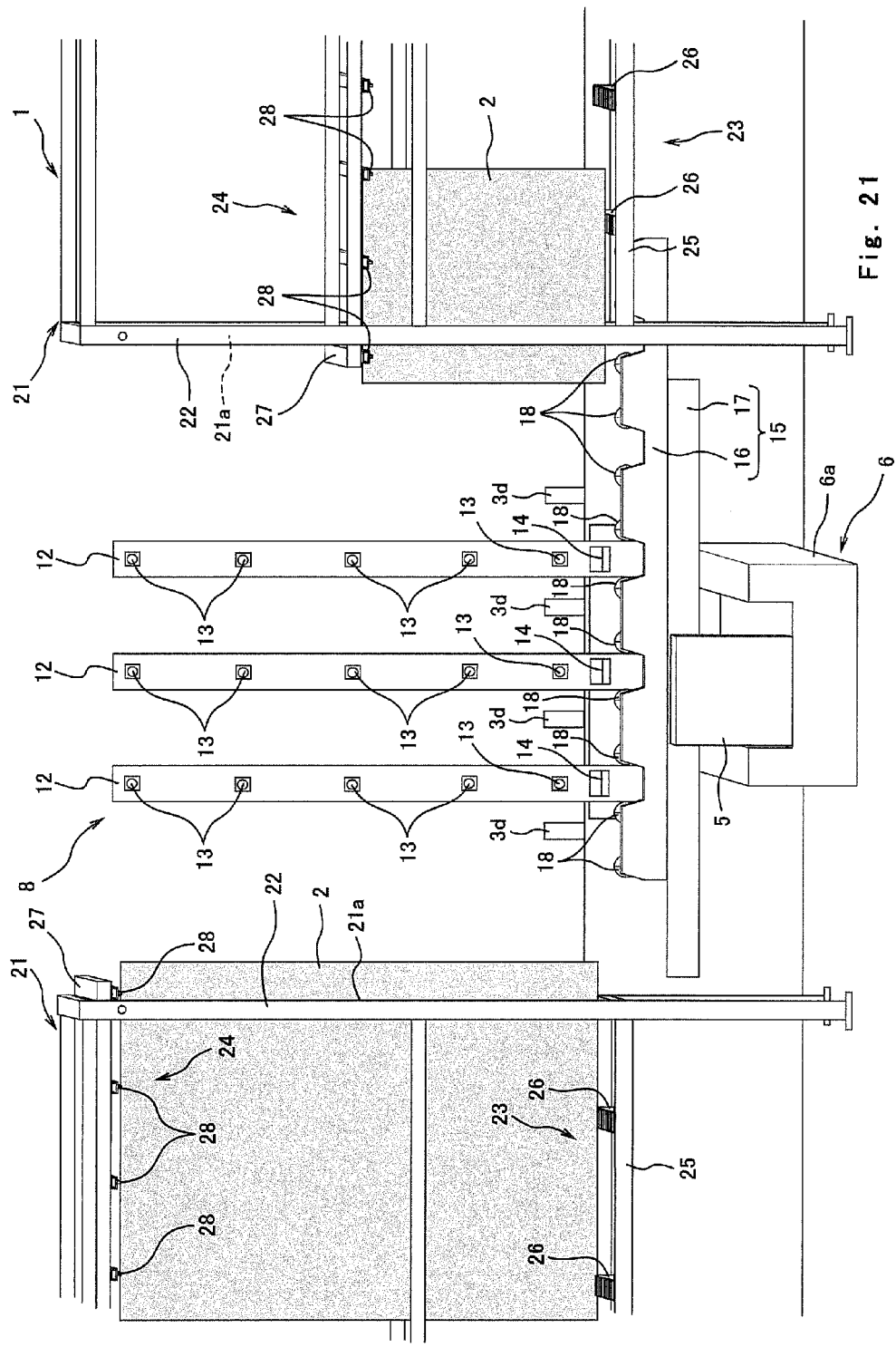
FIG. 21 is a front view showing a state where the slide member has been moved from the state of FIG. 20, and a part of the slide member has been caused to get into under a right rack, when viewed from the front.

When the flip 8 is stood, the controller 20 maintains this state and causes the base 5 to slide forward by the base drive mechanism 6 (see FIGS. 1 and 10). In FIG. 10 and subsequent drawings (FIGS. 10, 12, 14, 18 to 21, 23, 24, and 26), in order to clearly show the transferring of the glass plate 2 between the stocker 4 and the rack 21, the other glass plates 2 stored in the rack 21 may be omitted. The flip 8 is caused to slide while maintaining the inclination of the flip 8 at the angle α. With this, the air flow rate of wind generated when the flip 8 moves can be reduced. Thus, the air flow rate acting on the glass plates 2 in the rack 21 can be reduced, and clattering of the glass plate 2 during the movement of the base 5 can be suppressed.

When the glass plate 2 is conveyed to the front of a storage position of the rack 21 in which this glass plate 2 is to be stored, the controller 20 stops the base 5. It should be noted that an identifier, such as a QR code or a non-contact IC, indicating identification information of the glass plate 2 may be attached to the glass plate 2. In this case, the storage position is determined by reading the identification information of the identifier. After the base 5 is stopped, the controller 20 causes the flip 8 to rotate by the flip drive mechanism 10 up to an angle β at which the flip 8 is placed substantially vertically, and thus the glass plate 2 is caused to stand (see FIGS. 11 and 12). The angle β is set in a range of 85° or larger and smaller than 90°. However, the angle β is not limited to this angle range.

When the glass plate 2 is stood by the flip 8, the controller 20 causes the slide member 16 to move downward by the slide lifting mechanism 17 to cause the plurality of driving members 18 to be located lower than the lower end side supporting body 23 of the rack 21. After that, the controller 20 causes the slide member 16 to slide by the slide lifting mechanism 17 toward the rack 21 in which the glass plate 2 is to be stored, that is, the left rack 21. The controller 20 causes a left end side of the slide member 16 to get into under the lower end side supporting body 23. When the left end of the slide member 16 reaches the supporting member 26 (second from the right in the present embodiment) that supports a left end of the glass plate 2, the controller 20 controls the operation of the slide lifting mechanism 17 to stop the slide member 16 (see FIGS. 13 and 14). At this time, the controller 20 controls the operation of the slide lifting mechanism 17 such that the recess 16b located on the portion that has gotten into under the lower end side supporting body 23 overlaps the supporting member 26 in plan view.

When the slide member 16 is stopped, the controller 20 causes the slide member 16 to move upward by the slide lifting mechanism 17 to insert the convex portion 16a of the slide member 16 between two supporting members 26 located on the right side. By further causing the slide member 16 to move upward, the driving members 18 project to be exposed from between the above two supporting members 26. Then, when the driving members 18 are moved upward to a position that is slightly higher than a position at which the driving members 18 are flush with the upper surfaces of the separators 26a, the controller 20 controls the operation of the slide lifting mechanism 17 to stop the upward movement of the slide member 16 (see FIG. 15). By causing the slide member 16 to slide and causing the slide member 16 to move upward as above, the left end portion of the slide member 16 is located in the rack 21, and the flip 8 is located at a right end portion side thereof. Thus, the slide member 16 is placed between the rack 21 and the flip 8. To be specific, the slide member 16 extends into the rack 21.

Immediately after the slide member 16 is placed between the rack 21 and the flip 8, the supporting portions 14 are higher in position than the driving members 18, and the glass plate 2 supported by the supporting portions 14 is spaced apart from the driving members 18 in the upper-lower direction. Therefore, after the slide member 16 is moved upward, the controller 20 slowly lowers the supporting portions 14 by the cylinder. By lowering the supporting portions 14, the glass plate 2 is mounted on the driving members 18. Thereafter, the controller 20 further lowers the supporting portions 14 to separate the supporting portions 14 from the glass plate 2 (see FIG. 16).

When the glass plate 2 is separated from the supporting portions 14, the controller 20 causes the driving members 18 to rotate in a counterclockwise direction by the rotation interlocking mechanism 19. When the driving members 18 rotate in a counterclockwise direction, the glass plate 2 mounted on the driving members 18 moves to the left side. At this time, the glass plate 2 leans on the flip 8. However, since the back surface of the glass plate 2 is supported by the spherical rollers 13, the glass plate 2 can move smoothly without falling rearward or forward.

By causing the glass plate 2 to move to the left side, the glass plate 2 is inserted in the insertion opening 21a of the rack 21 (to be specific, the glass plate 2 is carried in the rack 21). By causing the glass plate 2 to further move to the left side, the upper end portion of the glass plate 2 is guided by the guide roller 28a (in FIG. 19, the guide roller 28a located on the near side), provided on the beam member 28 closest to the insertion opening 21a, to be fittingly inserted between this guide roller 28a and the adjacent guide roller 28a. Since the upper end portion of the glass plate 2 is fittingly inserted between two guide rollers 28a as above, the glass plate 2 is supported by the guide rollers 28a so as not to fall.

Even after the glass pate 2 is fittingly inserted between two guide rollers 28a, the controller 20 causes the driving members 18 to rotate in a counterclockwise direction by the rotation interlocking mechanism 19 to cause the glass plate 2 to slide to the left side. When the glass plate 2 further proceeds straightforward to the left side, the upper end portion of the glass plate 2 is sequentially, fittingly inserted between the guide rollers 28a of each of the other beam members 28 located on the left back side (see FIGS. 17 to 19). Thereafter, the controller 20 causes the driving members 18 to further rotate in a counterclockwise direction by the rotation interlocking mechanism 19. When the glass plate 2 reaches the storage position, the controller 20 causes the rotation interlocking mechanism 19 to stop the rotation of the driving members 18.

When the glass plate 2 is moved up to the storage position as above, the glass plate 2 is located on two supporting members 26. After that, the controller 20 causes the slide member 16 to move downward by the slide lifting mechanism 17, and the lower end portion of the glass plate 2 is slowly inserted between two adjacent separators 26a of each supporting member. Thus, the lower end portion of the glass plate 2 is supported by the supporting members 26 (see FIG. 20). As above, the glass plate 2 is stored in the rack 21 such that the lower end portion thereof is supported by the supporting members 26 from below, and the upper end portion thereof is supported by the guide rollers 28a so as not to fall. Even after the glass plate 2 is stored in the rack, the controller 20 further causes the slide member 16 to move downward by the slide lifting mechanism 17. After all the driving members 18 are moved to a lower side of the lower end side supporting body 23, the controller 20 stops the downward movement of the slide member 16. Then, the controller 20 causes the slide member 16 to slide to the right side by the slide lifting mechanism 17 to return the slide member 16 to a middle position.

Operation of Taking Out Glass Plate

Next, the operations of the stocker 4 when taking out the glass plate 2 from the opposite rack 21 (that is, the right rack 21) (to be specific, when carrying the glass plate 2 out from the rack 21) will be explained in reference to FIGS. 1, 2, and 21 to 29. After the slide member 16 is returned to the middle position, the controller 20 causes the slide member 16 to keep sliding to the right side and get into under the right rack 21. When the right end of the slide member 16 reaches the supporting member 26 (second from the left in the present embodiment) that supports a right end of the glass plate 2, the controller 20 controls the operation of the slide lifting mechanism 17 to stop the sliding of the slide member 16 (see FIG. 21). At this time, the controller 20 controls the operation of the slide lifting mechanism 17 such that the recess 16b located on the portion that has gotten into under the lower end side supporting body 23 overlaps the supporting member 26 in plan view.

After that, the controller 20 causes the slide member 16 to move upward by the slide lifting mechanism 17 to insert the convex portion 16a of the slide member 16 between two supporting members 26 located on the left side. By further causing the slide member 16 to move upward, the driving members 18 project to be exposed from between the above two supporting members 26. Thus, the glass plate 2 stored in the rack 21 is mounted on the driving members 18. Thereafter, the controller 20 further causing the slide member 16 to move upward. When the driving members 18 are moved upward to a position that is slightly higher than a position at which the driving members 18 are flush with the upper surfaces of the separators 26a, the controller 20 controls the operation of the slide lifting mechanism 17 to stop the upward movement of the slide member 16. With this, the slide member 16 on which the glass plate 2 is mounted is placed between the rack 21 and the flip 8. To be specific, the slide member 16 extends into the rack 21. In a case where the slide member 16 is caused to extend into the rack 21 as above, the glass plate 2 can be caused to move to the back side in the rack 21, so that it becomes unnecessary to provide a conveying mechanism in the rack 21. With this, the number of components of the stocker facility 1 can be reduced, and the manufacturing cost of the stocker facility can be reduced.

Figure 22:
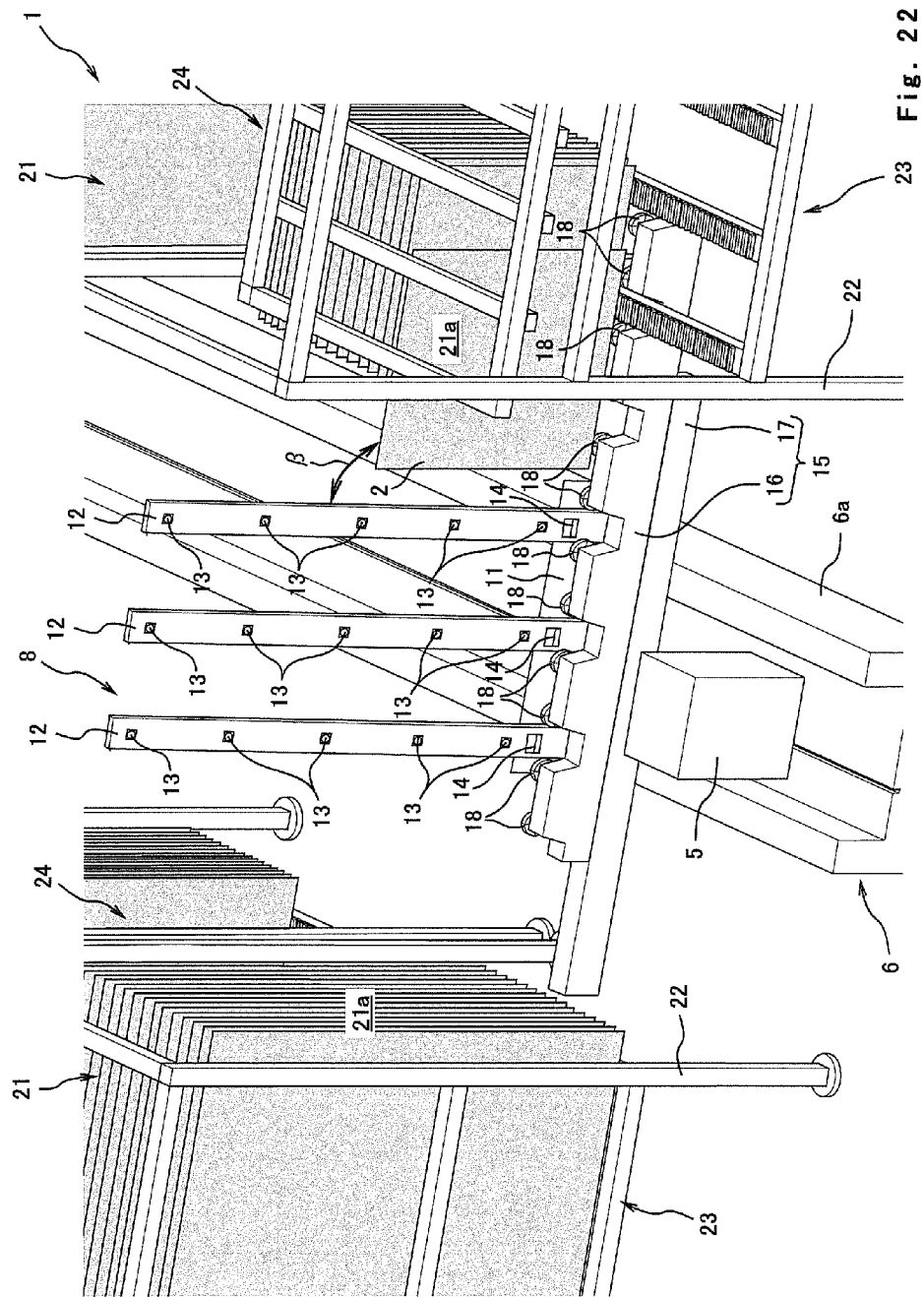
FIG. 22 is an enlarged front view showing a state where the glass plate stored in the right rack is being moved to the flip from the state of FIG. 21.
Figure 23:
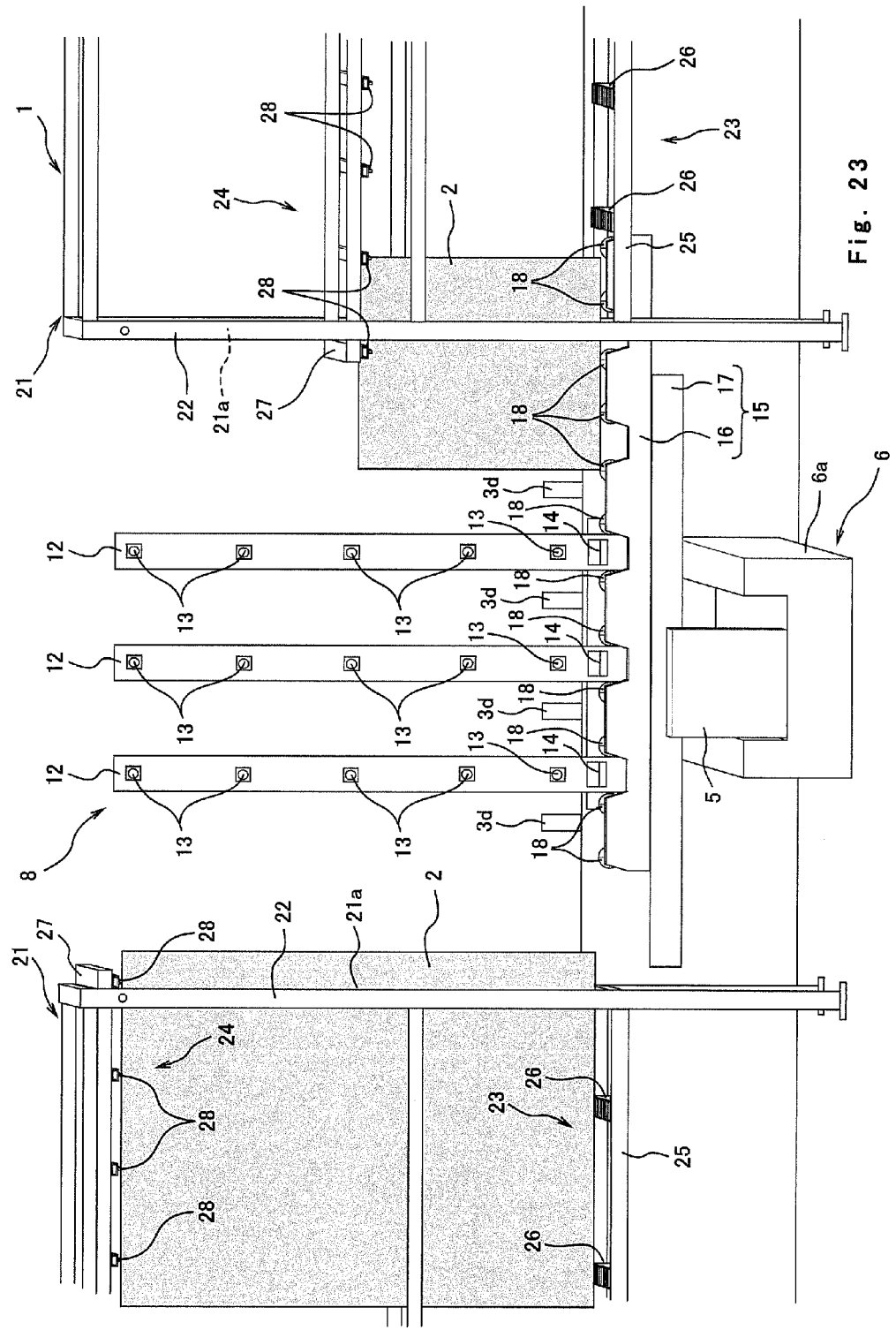
FIG. 23 is a front view of the stocker facility in the state of FIG. 22 when viewed from the front.
Figure 24:
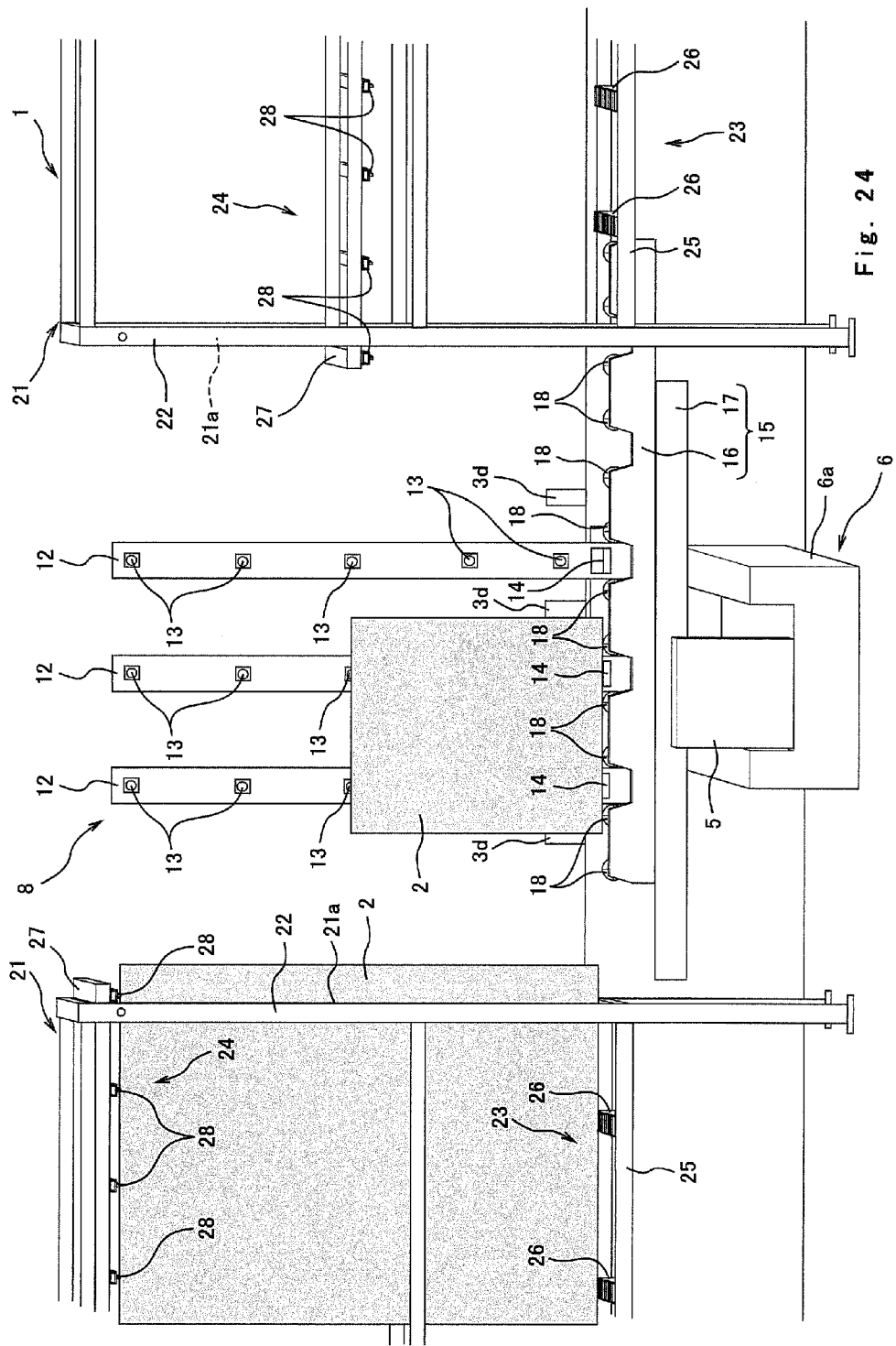
FIG. 24 is a front view showing a state where the glass plate has been caused to further slide from the state of FIG. 23 to be moved up to the front of the flip, when viewed from the front.
Figure 25:
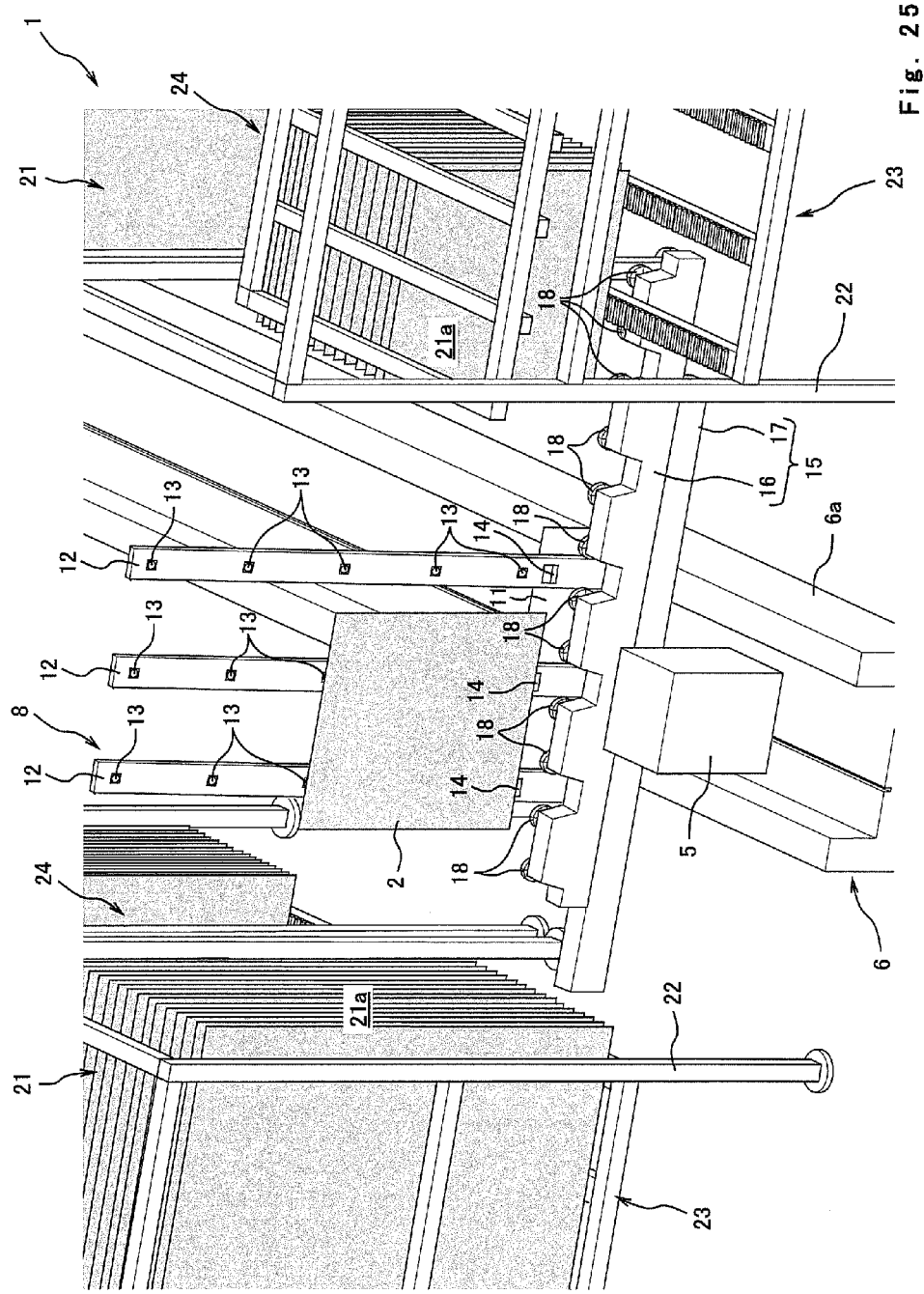
FIG. 25 is an enlarged perspective view showing a state where the supporting portions have been moved upward from the state of FIG. 24, and the glass plate has been mounted on the supporting portions.
Figure 26:
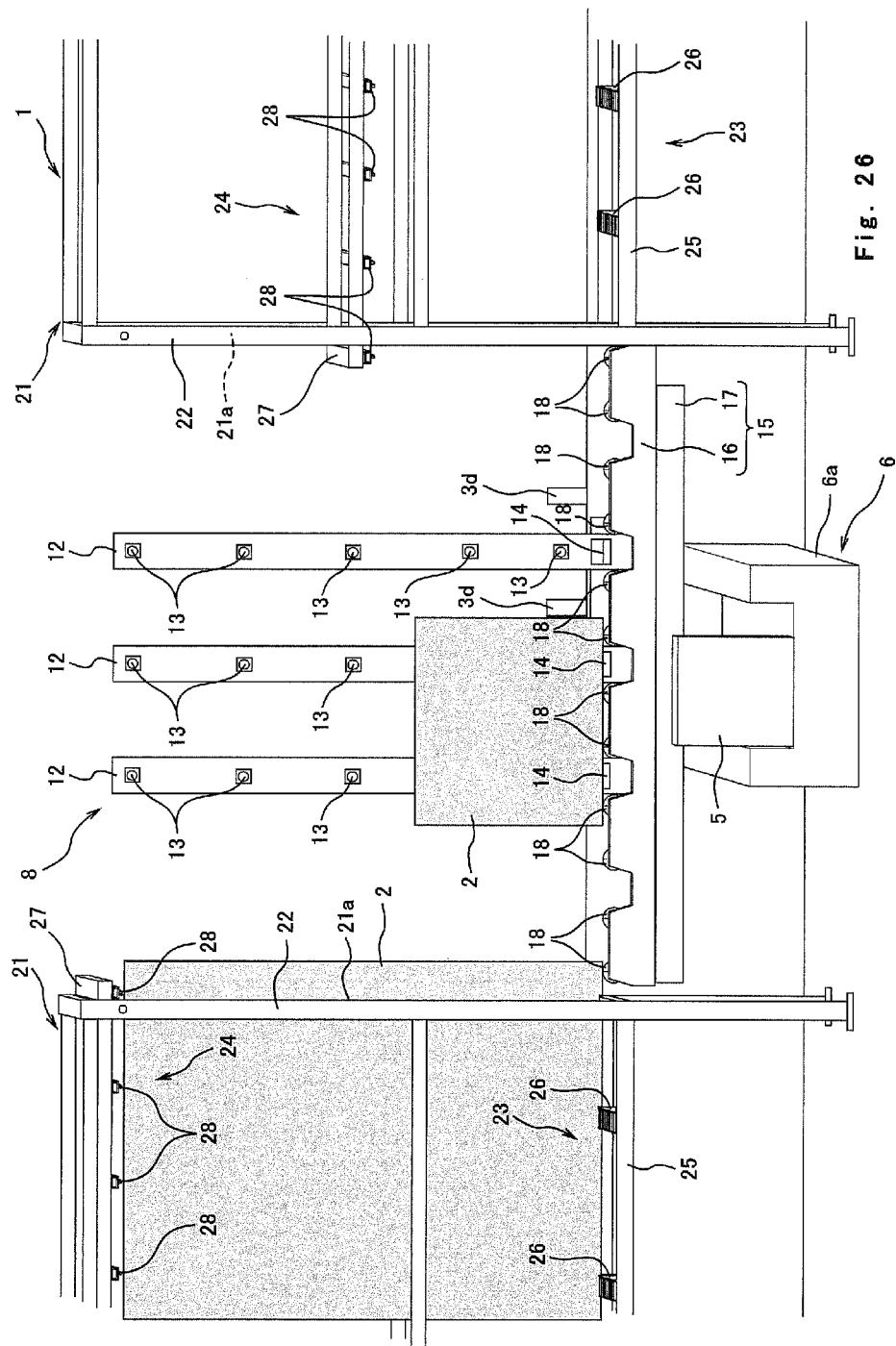
FIG. 26 is a front view showing a state where the flip has been rotated to be laid from the state of FIG. 25, when viewed from the front.
Figure 27:
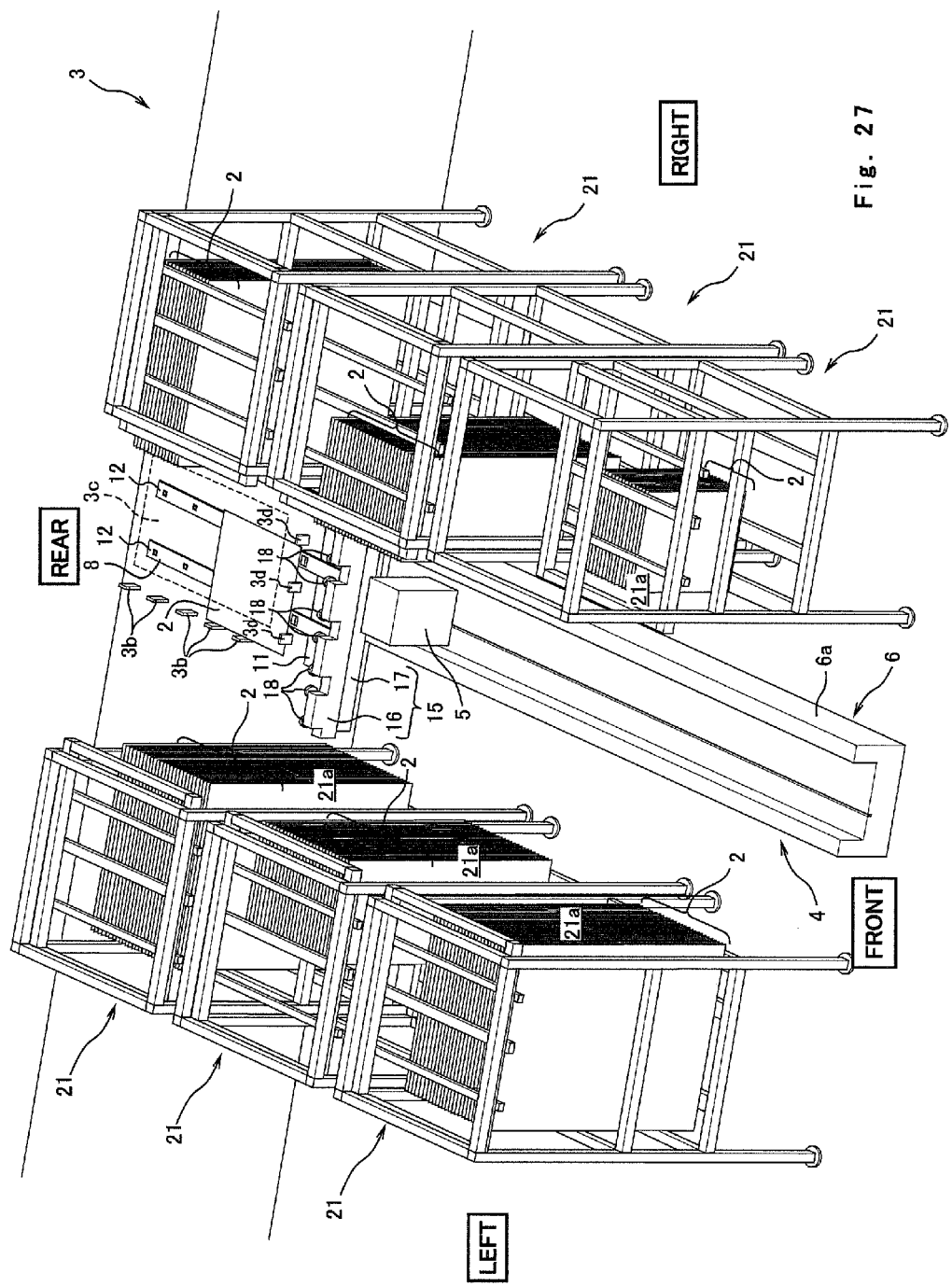
FIG. 27 is a perspective view showing a state where the stocker has been moved backward from the state of FIG. 26, and the glass plate has been moved up to the wheel conveyor.
Figure 28:
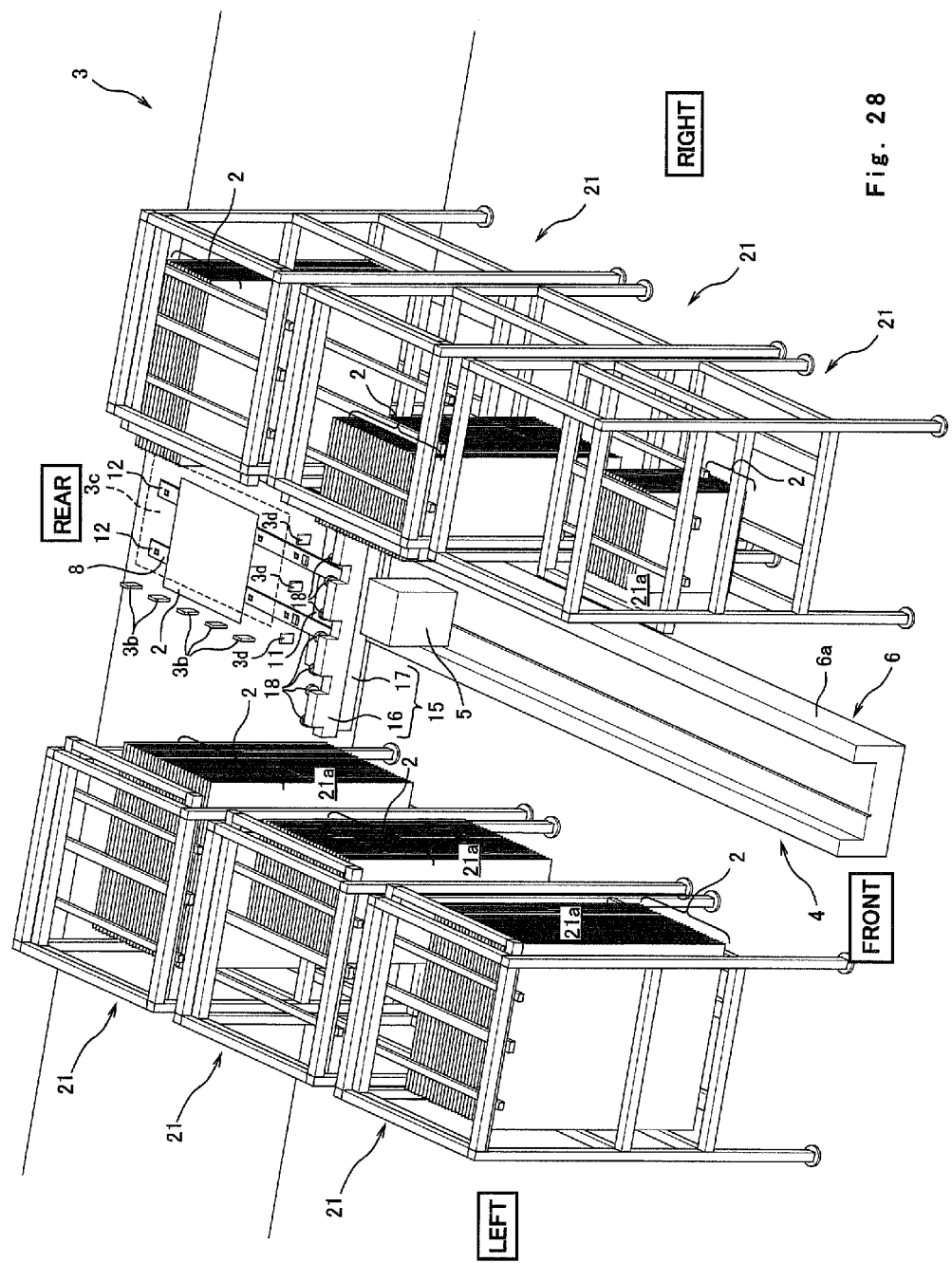
FIG. 28 is a perspective view showing a state where the glass plate has been caused to slide backward by the slide device from the state of FIG. 27.
Figure 29:
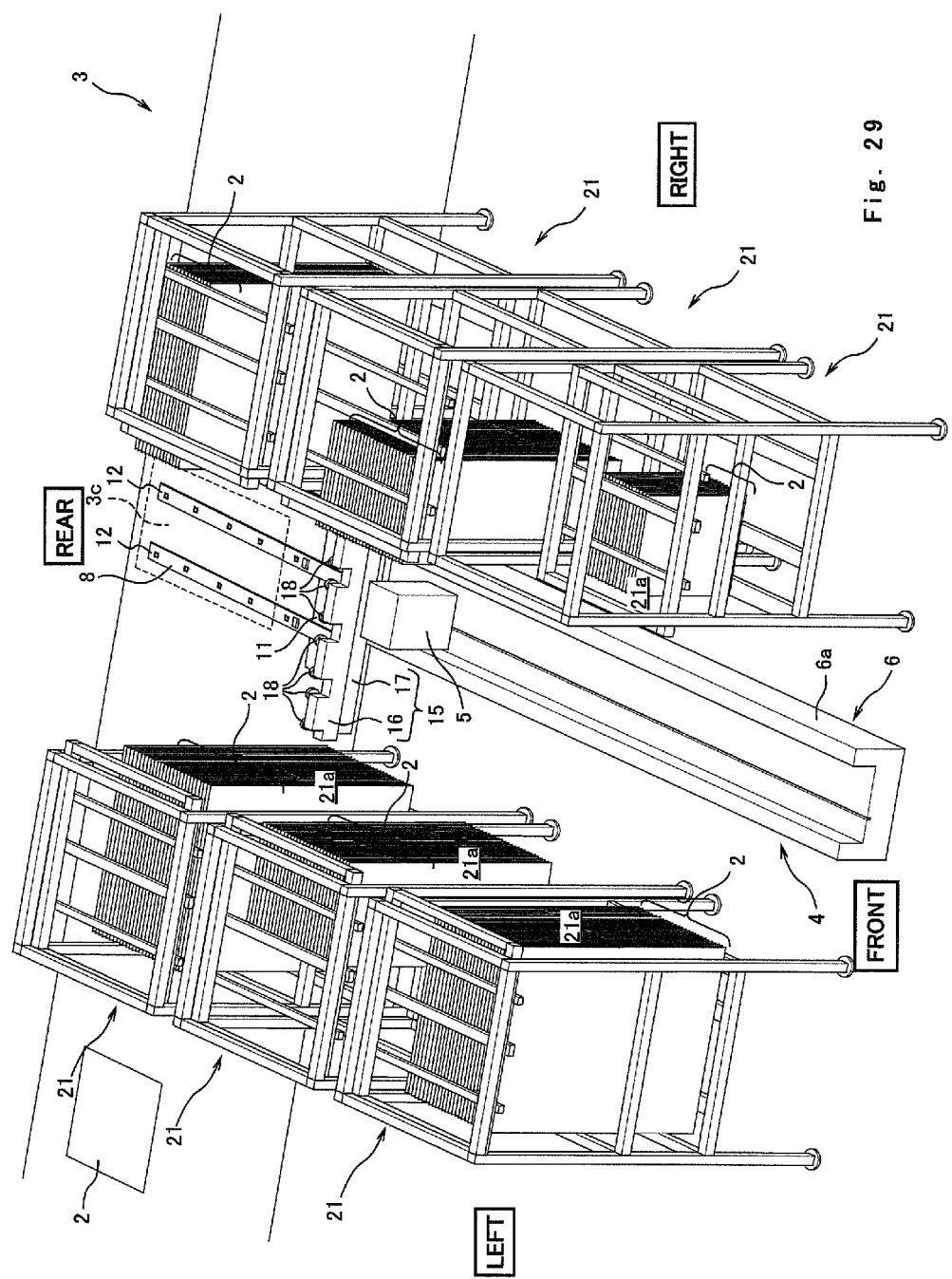
FIG. 29 is a perspective view showing a state where the downstream stoppers have been moved downward from the state of FIG. 28, and the glass plate has been moved to a downstream side.
Figure 30:
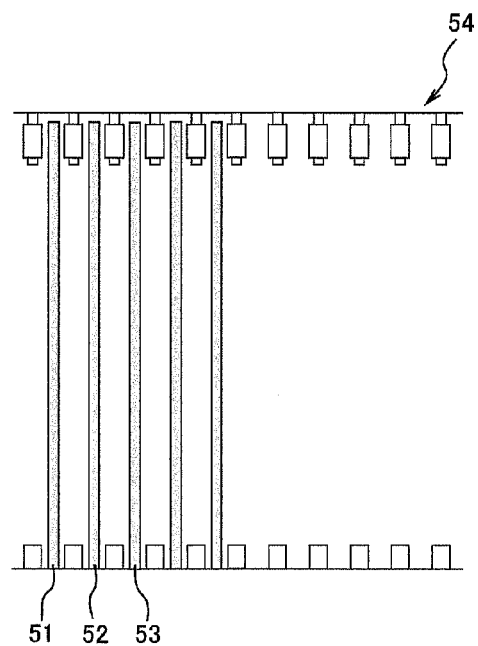
FIG. 30 is a front view of the rack capable of storing a plurality of substrates, when viewed from the front.
Figure 31:
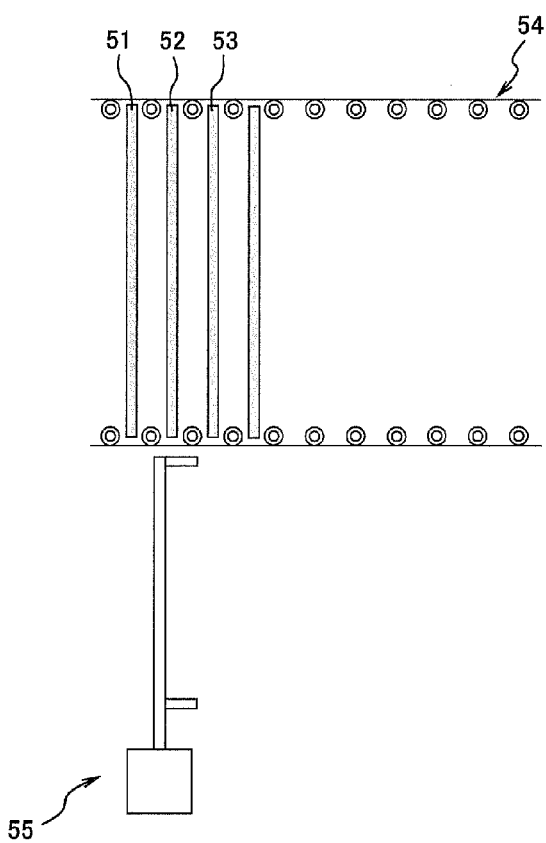
FIG. 31 is a plan view of the rack shown in FIG. 30 and an end effector, when viewed from above.

After stopping the upward movement of the slide member 16, the controller 20 causes the driving members 18 to rotate in a counterclockwise direction by the rotation interlocking mechanism 19 to cause the glass plate 2, mounted on the driving members 18, to move to the left side (see FIGS. 22 and 23). At this time, the glass plate 2 moves to the left side while the upper end thereof is being supported by the guide rollers 28a. When the left end side of the glass plate 2 reaches the flip 8, the left end side leans on the spherical rollers 13 to be supported by the spherical rollers 13. When the right end side of the glass plate 2 also gets out from the rack 21, the glass plate 2 is supported only by the spherical rollers 13 and is moved to the predetermined position on the flip 8 (see FIG. 24). When the glass plate 2 reaches the predetermined position, the controller 20 controls the operation of the rotation interlocking mechanism 19 to stop the rotation of the driving members 18.

After the driving members 18 are stopped, the controller 20 causes the supporting portions 14 to move upward by the cylinder to mount the glass plate 2 on the supporting portions 14. The controller 20 causes the supporting portions 14 to keep moving upward to separate the glass plate 2 from the driving members 18. When the glass plate 2 is separated from the driving members 18, the controller 20 controls the operation of the cylinder to stop the upward movement of the supporting portions 14 (see FIG. 25). After that, the controller 20 causes the flip 8 to be laid up to the angle α by the flip drive mechanism 10 and then causes the base 5 to slide backward by the base drive mechanism 6 (see FIG. 26). When the base 5 reaches the wheel conveyor 3, the controller 20 controls the operation of the base drive mechanism 6 to stop the sliding of the base 5 and further controls the operation of the flip drive mechanism 10 to cause the flip 8 to be laid up to the horizontal state.

When the posture of the flip 8 becomes the horizontal state, the controller 20 causes the flip 8 to move downward by the hinge lifting mechanism 7 such that the spherical rollers 13 are flush with or lower in position than the rollers of the wheel axles. Thus, the glass plate 2 is mounted on the wheel conveyor 3 (see FIG. 27). After that, the glass plate 2 is moved rearward by the slide device 3c of the wheel conveyor 3 to be returned to a width-direction middle position (see FIG. 28). Then, the wheel conveyor 3 causes the glass plate 2 to move to the downstream side (see FIG. 29).

As above, the stocker facility 1 can store the glass plate 2 in the rack 21 in such a manner that the glass plate 2 is caused to slide by the slide member 16, placed between the flip 8 and the rack 21, to be inserted into the insertion opening 21a of the rack 21. At this time, since the glass plate 2 is supported by the flip 8, the glass plate 2 can be stored in the rack 21 in a standing state without laying the glass plate 2. In addition, the glass plate 2 stored in the rack 21 in a standing state can be caused to slide by the slide member 16, placed between the flip 8 and the rack 21, to be taken out from the rack 21.

As above, the glass plate 2 is transferred to and received from the rack 21 by causing the glass plate 2 to move in the left-right direction by the slide member 16. Therefore, when the glass plate 2 is carried in the rack or carried out from the rack, it is unnecessary to directly insert the slide member 16 and the flip 8 into the insertion opening 21a of the rack 21. With this, even if the interval between the glass plates 2 is reduced, that is, the storage pitch between the glass plates 2 is shortened in order to reduce the installation area of the stocker facility 1, the glass plate 2 can be carried in between two glass plates 2, and any one of the plurality of glass plates 2 stored in the rack can be carried out without causing a problem in which the stored glass plate 2 and the end effector contact each other to be damaged as in the prior art. Therefore, the glass plate 2 can be surely, quickly carried in the rack 21 and carried out from the rack 21.

According to the stocker facility 1 of the present embodiment, the glass plate 2 moving on the wheel conveyor 3 is lifted and stood by the stocker 4 from below, and the glass plate 2 is caused to move in this state. Therefore, the flip 8 does not contact the upper surface (or front surface) of the glass plate 2. In the case of the solar panel and the liquid crystal panel, various components are arranged on one surface of the glass plate 2, so that only the rear side of the glass plate 2 is accessible. In the stocker facility 1, the glass plate 2 moving on the wheel conveyor 3 such that the above one surface thereof faces upward is lifted and stood, and the glass plate 2 is caused to move in this state. Therefore, according to the stocker facility 1, the glass plate 2 can be caused to move between the wheel conveyor 3 and the rack 21 such that the above one surface thereof faces upward (frontward). Thus, the glass plate 2 can be caused to move without damaging the components on the glass plate 2.

The stocker facility 1 of the present embodiment can cause the slide member 16 to move upward and downward by the slide lifting mechanism 17 to adjust the positional relation between the glass plate 2 and the lower end side supporting body 23 of the rack 21 in the upper-lower direction. Therefore, when the controller 20 transfers and receives the glass plate 2 to and from the rack 21, the driving members 18 of the slide member 16 are caused to move by the slide lifting mechanism 17 so as to be located at a position slightly higher than a position at which the driving members 18 are flush with the separators 26a, and then the glass plate 2 is caused to slide. When the glass plate 2 reaches the storage position, the glass plate 2 is slowly moved downward. By causing the glass plate 2 to move downward as above, the difference in height between the slide member 16 and the separator 26a can be eliminated, and the glass plate 2 can be prevented from falling down. In addition, since the glass plate 2 is located higher than the separators 26a, the glass plate 2 can be prevented from sliding on the rack 21 when transferring and receiving the glass plate 2. Therefore, the damage of the glass plate 2 and the generation of dusts can be prevented during the storage.

Further, according to the stocker facility 1 of the present embodiment, when transferring the glass plate 2 between the stocker 4 and the rack 21, the convex portion 16a is inserted between two spaced-apart supporting members 26. Therefore, the driving members 18 can be exposed from between the supporting members 26. With this, the glass plate 2 can be caused to move smoothly even in the rack 21 in the left-right direction, and the transferring of the glass plate 2 between the rack 21 and the flip 8 can be smoothly performed.

Even if the configuration in which a part of the slide member 16 is caused to get into under the rack 21 to overlap the supporting member as in the present embodiment is not realized, the glass plate 2 can be transferred to the storage position. For example, the configuration may be such that the end portion of the slide member 16 is caused to slide up to the front of the rack 21, and the slide member 16 is placed between the rack 21 and the flip 8. At this time, even if there is a gap between the slide member 16 and the rack 21, no problem occurs as long as the glass plate 2 can be transferred between the rack 21 and the slide member 16.

According to the stocker facility 1 of the present embodiment, the glass plate 2 is supported by the plurality of spherical rollers 13 of the flip 8. Therefore, when the glass plate 2 is caused to slide by the driving members 18, the glass plate 2 can be caused to move smoothly with the glass plate 2 leaning on the flip 8. With this, when transferring the glass plate 2 between the rack 21 and the flip 8, the glass plate 2 can be prevented from falling. In addition, although the damage of the glass plate 2 and the generation of dusts occur by causing the glass plate 2 to slide on the supporting plates 12 of the flip 8, these troubles can be prevented.

Other Embodiment

In the present embodiment, when the base 5 is caused to move, the glass plate 2 is just supported by the supporting plates 12. However, an adsorption mechanism may be provided at the supporting plate 12 to adsorb the glass plate 2. Instead of the adsorption mechanism, a chuck or the like may be provided, and the flip 8 may hold the glass plate 2 only when the base 5 is caused to move.

In the present embodiment, when the base 5 is caused to move, the flip 8 is inclined at the angle α. However, the present embodiment is not limited to the angle α. The flip 8 may be inclined at the angle β. At this time, the controller 20 controls the operation of the base drive mechanism 6 to reduce the movement speed of the base 5. Thus, the air flow rate of the wind generated by the glass plate 2 can be reduced.

As described above, the driving members 18 are not limited to rollers and may be a belt mechanism, and any member may be used as the driving member 18 as long as it can cause the glass plate 2 to slide in the left or right direction. In the present embodiment, the flip 8 is stood or laid up to the angle α, and then the base 5 is caused to slide. However, this operation of standing or laying the flip 8 does not have to be performed when the base 5 is caused to slide. The base 5 may be caused to slide with the flip 8 laid, and then the flip 8 may be stood up to the angle β after it reaches the front of the storage position. Moreover, after the flip 8 receives the stored glass plate 2, the base 5 may be caused to slide with the flip 8 inclined at the angle β.

The rack 21 includes the guide rollers 28a. However, the guide rollers 28a do not have to be rollers. For example, the guide rollers 28a may be configured as the separators 26a, and any components may be used as long as two glass plates 2 adjacently stored can be stored separately from each other. In addition, the shape of the rack 21 is not limited to the above-described shape.

In the present embodiment, the conveying mechanism 15 is provided between two racks 21. However, the position of the conveying mechanism 15 is not limited to this. For example, the conveying mechanism 15 may be provided under the rack 21. In this case, transporting devices each having the same configuration as the base 5 are respectively provided under the racks 21, and the conveying mechanism 15 is configured to be movable in the front-rear direction by these transporting devices. In this case, the base 5 and the transporting devices constitute a transporting mechanism. In the stocker facility configured as above, the slide member 16 of the conveying mechanism 15 slides from under the rack 21 toward the flip 8, and the glass plate can be transferred between the rack 21 and the flip 8 by the slide member 16.

In the present embodiment, the slide lifting mechanism 17 has a sliding function of causing the slide member 16 to slide in the conveying direction. However, the slide lifting mechanism 17 does not have to have the sliding function. In this case, a structure including driving members capable of transferring the glass plate 2 in the left-right direction is provided under the rack 21. With this, the glass plate 12 transferred to the rack 21 by the driving members 18 of the slide member 16 can be caused to slide in the rack 21 by the driving members provided in the rack 21. Further, the above-described transporting mechanism is provided and configured to be able to cause the structure to move in the front-rear direction and causes the structure to move in the front-rear direction so as to correspond to the slide member 16. With this, it becomes unnecessary to provide the driving members for each storage position of the glass plate 2. Thus, the number of components can be reduced, and the glass plates 2 can be stored more densely.

INDUSTRIAL APPLICABILITY

The present invention is applicable to a stocker facility including a rack capable of storing plate-shaped members such that the which plate-shaped members are arranged and a stocker configured to insert the plate-shaped members into the rack.

REFERENCE SIGNS LIST 1 stocker facility
2 glass plate
4 stocker
5 base
6 base drive mechanism
7 hinge lifting mechanism
8 flip
10 flip drive mechanism
13 spherical roller
14 supporting portion
15 conveying mechanism
16 slide member
16a convex portion
16b recess
17 slide lifting mechanism
18 driving member
19 rotation interlocking mechanism
20 controller
21 rack
26 supporting member

The invention claimed is:

1. A plate-shaped member transfer facility comprising:
a rack configured to store a plurality of plate-shaped members such that the plurality of plate-shaped members are arranged in an arrangement direction intersecting with a conveying direction, the plurality of plate-shaped members being supported by supporting portions and standing to extend in the conveying direction, the rack further configured such that the plurality of plate-shaped members are able to be carried therein in the conveying direction and carried out therefrom in the conveying direction; and
a plate-shaped member transfer mechanism configured to carry the plate-shaped members in the rack in the conveying direction and carry the plate-shaped members out from the rack in the conveying direction, wherein:
the plate-shaped member transfer mechanism includes
a flip rotating mechanism including a flip and configured to cause the flip to rotate to stand or lay the plate-shaped member, the flip being configured to support the plate-shaped member and be rotatable about a rotation axis line parallel to the conveying direction,
a conveying mechanism including a conveyance body in which a feed portion is formed, the feed portion extending in the conveying direction and being configured to transfer the plate-shaped member in a standing state in the conveying direction, and
a transporting mechanism configured to cause the flip rotating mechanism and the conveying mechanism to move in the arrangement direction; and
the conveying mechanism is configured to be able to cause the conveyance body to move in the conveying direction from the flip to extend into the rack and is also configured such that the plate-shaped member in the standing state is transferred between the rack and the flip by the feed portion.

2. The plate-shaped member transfer facility according to claim 1, wherein the conveying mechanism is configured to be able to cause the conveyance body to move in an upper-lower direction.

3. The plate-shaped member transfer facility according to claim 2, wherein:
the plurality of supporting portions are arranged in the rack so as to be spaced apart from one another in the conveying direction;
the feed portion of the conveyance body includes a plurality of driving members arranged in the conveyance body so as to be scattered in the conveying direction and configured to transfer the plate-shaped member in the conveying direction; and a plurality of recesses are formed on the conveyance body so as to correspond to the plurality of supporting portions, and the at least one driving member is provided at a convex portion formed between the adjacent recesses.

4. The plate-shaped member transfer facility according to claim 3, wherein the conveying mechanism is configured to: position the conveyance body such that an upper end of the convex portion is lower in position than the supporting portions of the rack at a reference position at which the conveyance body is located on a conveying-direction near side of the rack; causes the conveyance body to move in the conveying direction from the reference position to position the recess under the supporting portions of the rack; and cause the conveyance position to move upward such that upper ends of the driving members are higher in position than the supporting portions of the rack.

5. The plate-shaped member transfer facility according to claim 4, wherein:

the flip includes a supporting portion configured to support the plate-shaped member when the flip stands; and the conveying mechanism is configured such that when the conveyance body is moved upward, the plate-shaped member supported by the supporting portion is mounted on the driving members.

6. The plate-shaped member transfer facility according to claim 1, wherein the flip includes a plurality of spherical rollers configured to be able to roll and is configured to support a rear surface of the plate-shaped member by the plurality of spherical rollers.

7. The plate-shaped member transfer facility according to claim 1, wherein the flip rotating mechanism is configured to, when the flip rotating mechanism moves, cause the flip to rotate to lay the plate-shaped member supported by the flip.

* * * * *